(12) United States Patent
Otsuki

(10) Patent No.: US 7,846,291 B2
(45) Date of Patent: *Dec. 7, 2010

(54) PROCESSING APPARATUS WITH A CHAMBER HAVING THEREIN A HIGH-CORROSION-RESISTANT SPRAYED FILM

(75) Inventor: Hayashi Otsuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/444,957

(22) Filed: May 27, 2003

(65) Prior Publication Data

US 2003/0200929 A1    Oct. 30, 2003

Related U.S. Application Data

(63) Continuation of application No. 09/731,722, filed on Dec. 8, 2000, now abandoned.

(30) Foreign Application Priority Data

Dec. 10, 1999    (JP) ................................ 11-352018

(51) Int. Cl.
  C23F 1/00      (2006.01)
  H01L 21/306    (2006.01)
  C23C 16/00     (2006.01)
  H01J 7/24      (2006.01)
  H05B 31/26     (2006.01)

(52) U.S. Cl. ............................ 156/345.1; 118/723 R; 315/111.21

(58) Field of Classification Search ............ 156/345.47, 156/345.43, 345.34, 345.51; 118/715, 723 E, 118/728; 438/706, 707, 710; 427/569

See application file for complete search history.

(56) References Cited

U.S. PATENT DOCUMENTS 4,310,390 A    1/1982    Bradley et al.

(Continued)

FOREIGN PATENT DOCUMENTS

AR        10-130884        5/1998

(Continued)

OTHER PUBLICATIONS

"Plasma-sprayed Alumina-Yttria Ceramic Coatings for Cavitation-Erosion Protection" by Hee Jae Kim. Journal of Corrosion Sci. Soc. of Korea. vol. 18, No. 3, Sep. 1989, pp. 140-146.*

(Continued)

Primary Examiner—Parviz Hassanzadeh
Assistant Examiner—Maureen Gramaglia
(74) Attorney, Agent, or Firm—Oblon, Spivak, McClelland, Maier & Neustadt, L.L.P.

(57) ABSTRACT

A processing apparatus of the present invention has a mounted chamber holding a semiconductor wafer and having members for work-processing the substrate under any of heating, plasma and process gas or a combination of them, in which a film of $Al_2O_3$ and $Y_2O_3$ is formed on an inner wall surface of the chamber and on those exposed surface of the members within the chamber and has a high-corrosion resistance and insulating property and, when the process gas is introduced onto a processing surface of a semiconductor wafer and diffused into it, any product is less liable to be deposited on a plasma generation area and on those members held within the chamber.

19 Claims, 19 Drawing Sheets

U.S. PATENT DOCUMENTS

| | | | |
|---|---|---|---|
| 4,357,387 A | 11/1982 | George et al. ................. 442/71 |
| 4,469,619 A | 9/1984 | Ohno et al. |
| 4,593,007 A | 6/1986 | Novinski |
| 4,612,077 A | 9/1986 | Tracy et al. |
| 4,649,858 A | 3/1987 | Sakai et al. |
| 4,842,683 A | 6/1989 | Cheng et al. |
| 4,877,757 A | 10/1989 | York et al. |
| 5,000,113 A | 3/1991 | Wang et al. |
| 5,074,456 A | 12/1991 | Degner et al. |
| 5,126,102 A | 6/1992 | Takahashi et al. |
| 5,180,467 A | 1/1993 | Cook et al. |
| 5,302,465 A | 4/1994 | Miller et al. |
| 5,334,462 A | 8/1994 | Vine et al. |
| 5,362,335 A | 11/1994 | Rungta |
| 5,366,585 A | 11/1994 | Robertson et al. |
| 5,367,838 A | 11/1994 | Visaisouk et al. |
| 5,423,936 A * | 6/1995 | Tomita et al. ........... 156/345.34 |
| 5,426,310 A | 6/1995 | Tamada et al. |
| 5,484,752 A | 1/1996 | Waku et al. |
| 5,489,449 A | 2/1996 | Umeya et al. |
| 5,494,713 A | 2/1996 | Ootuki |
| 5,521,790 A | 5/1996 | Ruckel et al. ................. 361/234 |
| 5,522,936 A | 6/1996 | Tamura |
| 5,534,356 A | 7/1996 | Mahulikar et al. |
| 5,551,190 A | 9/1996 | Yamagishi et al. |
| 5,556,501 A | 9/1996 | Collins et al. |
| 5,614,055 A | 3/1997 | Fairbairn et al. |
| 5,637,237 A | 6/1997 | Oehrlein et al. |
| 5,641,375 A | 6/1997 | Nitescu et al. |
| 5,651,723 A | 7/1997 | Bjornard et al. |
| 5,680,013 A | 10/1997 | Dornfest et al. |
| 5,725,960 A | 3/1998 | Konishi et al. |
| 5,759,360 A | 6/1998 | Ngan et al. |
| 5,798,016 A | 8/1998 | Oehrlein et al. |
| 5,820,723 A | 10/1998 | Benjamin et al. |
| 5,834,070 A | 11/1998 | Movchan et al. |
| 5,851,343 A | 12/1998 | Hsu et al. |
| 5,868,848 A | 2/1999 | Tsukamoto |
| 5,879,575 A | 3/1999 | Tepman et al. |
| 5,882,411 A | 3/1999 | Zhao et al. |
| 5,885,356 A | 3/1999 | Zhao et al. |
| 5,885,402 A | 3/1999 | Esquibel ................. 156/345.24 |
| 5,891,253 A | 4/1999 | Wong et al. |
| 5,891,350 A | 4/1999 | Shan et al. |
| 5,892,278 A | 4/1999 | Horita et al. ................. 257/706 |
| 5,894,887 A | 4/1999 | Kelsey et al. |
| 5,895,586 A | 4/1999 | Kaji et al. |
| 5,900,064 A | 5/1999 | Kholodenko |
| 5,902,763 A * | 5/1999 | Waku et al. ................. 501/127 |
| 5,904,778 A | 5/1999 | Lu et al. |
| 5,911,852 A * | 6/1999 | Katayama et al. ....... 156/345.41 |
| 5,919,332 A | 7/1999 | Koshiishi et al. |
| 5,925,228 A | 7/1999 | Panitz et al. ................. 204/484 |
| 5,944,902 A | 8/1999 | Redeker et al. |
| 5,948,521 A | 9/1999 | Dlugosch et al. |
| 5,952,054 A | 9/1999 | Sato et al. |
| 5,952,060 A | 9/1999 | Ravi |
| 5,955,182 A | 9/1999 | Yasuda et al. |
| 5,968,377 A | 10/1999 | Yuasa et al. |
| 5,985,102 A | 11/1999 | Leiphart |
| 5,994,662 A | 11/1999 | Murugesh |
| 6,068,729 A | 5/2000 | Shrotriya ................. 156/345.26 |
| 6,073,449 A | 6/2000 | Watanabe et al. ............. 62/3.2 |
| 6,079,356 A | 6/2000 | Umotoy et al. |
| 6,082,444 A | 7/2000 | Harada et al. |
| 6,096,161 A | 8/2000 | Kim et al. |
| 6,106,625 A | 8/2000 | Koai et al. |
| 6,108,189 A | 8/2000 | Weldon et al. |
| 6,110,287 A | 8/2000 | Arai et al. |
| 6,120,640 A | 9/2000 | Shih et al. |
| 6,120,955 A | 9/2000 | Tokutake et al. |
| 6,123,791 A | 9/2000 | Han et al. |
| 6,123,804 A | 9/2000 | Babassi et al. |
| 6,129,808 A | 10/2000 | Wicker et al. |
| 6,139,983 A | 10/2000 | Ohashi et al. |
| 6,143,646 A | 11/2000 | Wetzel |
| 6,170,429 B1 | 1/2001 | Schoepp et al. |
| 6,176,969 B1 | 1/2001 | Park et al. |
| 6,178,919 B1 | 1/2001 | Li et al. |
| 6,182,603 B1 | 2/2001 | Shang et al. |
| 6,210,486 B1 | 4/2001 | Mizukami et al. |
| 6,221,202 B1 | 4/2001 | Walko, II |
| 6,246,479 B1 | 6/2001 | Jung et al. |
| 6,264,788 B1 | 7/2001 | Tomoyasu et al. |
| 6,265,757 B1 | 7/2001 | Brady et al. |
| 6,266,133 B1 | 7/2001 | Miyajima et al. |
| 6,296,716 B1 | 10/2001 | Haerle et al. |
| 6,296,740 B1 | 10/2001 | Xie et al. |
| 6,335,293 B1 | 1/2002 | Luo et al. |
| 6,364,949 B1 | 4/2002 | Or et al. |
| 6,368,987 B1 | 4/2002 | Kopacz et al. |
| 6,373,573 B1 | 4/2002 | Jung et al. |
| 6,383,333 B1 | 5/2002 | Haino et al. |
| 6,383,964 B1 | 5/2002 | Nakahara et al. |
| 6,387,817 B1 | 5/2002 | Buckfeller |
| 6,394,026 B1 | 5/2002 | Wicker et al. |
| 6,413,578 B1 | 7/2002 | Stowell et al. |
| 6,444,083 B1 | 9/2002 | Steger et al. |
| 6,514,377 B1 | 2/2003 | Morimoto |
| 6,519,037 B2 | 2/2003 | Jung et al. |
| 6,527,911 B1 | 3/2003 | Yen et al. |
| 6,533,910 B2 | 3/2003 | O'Donnell et al. |
| 6,537,429 B2 | 3/2003 | O'Donnell et al. |
| 6,544,380 B2 | 4/2003 | Tomoyasu et al. |
| 6,554,906 B1 | 4/2003 | Kuibira et al. |
| 6,562,186 B1 | 5/2003 | Saito et al. ............. 156/345.24 |
| 6,570,654 B2 | 5/2003 | Jung et al. |
| 6,583,064 B2 | 6/2003 | Wicker et al. |
| 6,590,660 B2 | 7/2003 | Jung et al. |
| 6,613,204 B2 | 9/2003 | Xie et al. |
| 6,613,442 B2 | 9/2003 | O'Donnell et al. |
| 6,632,549 B1 | 10/2003 | Ohashi et al. |
| 6,641,697 B2 | 11/2003 | Han et al. |
| 6,663,714 B2 | 12/2003 | Mizuno et al. |
| 6,695,929 B2 | 2/2004 | Kanekiyo et al. |
| 6,724,140 B2 | 4/2004 | Araki |
| 6,726,801 B2 | 4/2004 | Ahn |
| 6,733,620 B1 | 5/2004 | Sugiyama et al. |
| 6,738,862 B1 | 5/2004 | Ross et al. |
| 6,771,483 B2 | 8/2004 | Harada et al. |
| 6,776,873 B1 | 8/2004 | Sun et al. |
| 6,783,863 B2 * | 8/2004 | Harada et al. ............. 428/469 |
| 6,783,875 B2 | 8/2004 | Yamada et al. |
| 6,798,519 B2 | 9/2004 | Nishimoto et al. |
| 6,805,952 B2 | 10/2004 | Chang et al. |
| 6,806,949 B2 | 10/2004 | Ludviksson et al. |
| 6,811,651 B2 | 11/2004 | Long |
| 6,830,622 B2 | 12/2004 | O'Donnell et al. |
| 6,833,279 B2 | 12/2004 | Choi |
| 6,837,966 B2 | 1/2005 | Nishimoto et al. |
| 6,852,433 B2 | 2/2005 | Maeda |
| 6,863,594 B2 | 3/2005 | Preising |
| 6,875,477 B2 | 4/2005 | Trickett et al. |
| 6,884,516 B2 * | 4/2005 | Harada et al. ............. 428/469 |
| 6,894,769 B2 | 5/2005 | Ludviksson et al. |
| 6,896,785 B2 | 5/2005 | Shatrov et al. |
| 7,147,749 B2 | 12/2006 | Nishimoto et al. |
| 7,163,585 B2 | 1/2007 | Nishimoto et al. |
| 7,300,537 B2 | 11/2007 | O'Donnell et al. |
| 7,311,797 B2 | 12/2007 | O'Donnell et al. |
| 7,364,798 B2 | 4/2008 | Harada et al. |
| 2001/0003271 A1 | 6/2001 | Otsuki |
| 2001/0050144 A1 | 12/2001 | Nishikawa et al. |
| 2002/0018921 A1 | 2/2002 | Yamada et al. |

| | | | | | | |
|---|---|---|---|---|---|---|
| 2002/0066532 A1 | 6/2002 | Shih et al. | | JP | 05-198532 | 8/1993 |
| 2002/0076508 A1 | 6/2002 | Chiang et al. | | JP | 05-238855 | 9/1993 |
| 2002/0086118 A1 | 7/2002 | Chang et al. | | JP | 05-238859 | 9/1993 |
| 2002/0086501 A1 | 7/2002 | O'Donnell et al. | | JP | 06-011346 | 2/1994 |
| 2002/0086545 A1 | 7/2002 | O'Donnell et al. | | JP | 06-057396 | 3/1994 |
| 2002/0086553 A1 | 7/2002 | O'Donnell et al. | | JP | 60-057396 | 3/1994 |
| 2002/0090464 A1 | 7/2002 | Jiang et al. | | JP | 06-136505 | 5/1994 |
| 2002/0142611 A1 | 10/2002 | O'Donnell et al. | | JP | 06-142822 | 5/1994 |
| 2002/0177001 A1 | 11/2002 | Harada et al. ............... 428/469 | | JP | 60-136505 | 5/1994 |
| 2003/0010446 A1 | 1/2003 | Kajiyama et al. | | JP | 60-142822 | 5/1994 |
| 2003/0029563 A1 | 2/2003 | Kaushal et al. | | JP | 06-196548 | 7/1994 |
| 2003/0084848 A1 | 5/2003 | Long | | JP | 06-256926 | 9/1994 |
| 2003/0113479 A1 | 6/2003 | Fukuda et al. ............... 427/569 | | JP | 06-287739 | 10/1994 |
| 2003/0150419 A1 | 8/2003 | Daragheh et al. | | JP | 07-058013 A | 3/1995 |
| 2003/0200929 A1 | 10/2003 | Otsuki | | JP | 07-126827 | 5/1995 |
| 2004/0026372 A1 | 2/2004 | Takenaka et al. | | JP | 07-176524 | 7/1995 |
| 2004/0035364 A1 | 2/2004 | Tomoyoshi et al. | | JP | 07-226378 | 8/1995 |
| 2004/0050495 A1 | 3/2004 | Sumiya et al. | | JP | 7-226378 | 8/1995 |
| 2004/0060516 A1 | 4/2004 | Nishimoto et al. | | JP | 07-245295 | 9/1995 |
| 2004/0060656 A1 | 4/2004 | Saigusa et al. | | JP | 08-037180 | 2/1996 |
| 2004/0060657 A1 | 4/2004 | Saigusa et al. | | JP | 08-041309 | 2/1996 |
| 2004/0060658 A1 | 4/2004 | Nishimoto et al. | | JP | 08-081777 | 3/1996 |
| 2004/0060661 A1 | 4/2004 | Nishimoto et al. | | JP | 8-81777 | 3/1996 |
| 2004/0060779 A1 | 4/2004 | Kreger | | JP | 8-268751 | 10/1996 |
| 2004/0061447 A1 | 4/2004 | Saigusa et al. | | JP | 08-268751 | 10/1996 |
| 2004/0063333 A1 | 4/2004 | Saigusa et al. | | JP | 08-339895 | 12/1996 |
| 2004/0072426 A1 | 4/2004 | Jung | | JP | 09-069554 | 3/1997 |
| 2004/0081746 A1 | 4/2004 | Imafuku | | JP | 09-228070 | 9/1997 |
| 2004/0083970 A1 | 5/2004 | Imafuku et al. | | JP | 09-272987 | 10/1997 |
| 2004/0125359 A1 | 7/2004 | Ludviksson et al. | | JP | 10-004083 | 1/1998 |
| 2004/0168640 A1 | 9/2004 | Muto et al. | | JP | 10-045461 | 2/1998 |
| 2004/0173155 A1 | 9/2004 | Nishimoto et al. | | JP | 10-045467 | 2/1998 |
| 2004/0216667 A1 | 11/2004 | Mitsuhashi et al. | | JP | 10-214819 | 8/1998 |
| 2005/0103268 A1 | 5/2005 | Nishimoto et al. | | JP | 10-226869 | 8/1998 |
| 2005/0103275 A1 | 5/2005 | Sasaki et al. | | JP | 10-251871 | 9/1998 |
| 2005/0150866 A1 | 7/2005 | O'Donnell et al. ............ 216/67 | | JP | 11-001757 | 1/1999 |
| 2006/0134919 A1 | 6/2006 | Hamelin et al. | | JP | 11-067746 | 3/1999 |
| 2007/0026246 A1 | 2/2007 | Harada et al. | | JP | 11-080925 | 3/1999 |
| 2008/0070051 A1 | 3/2008 | Harada et al. | | JP | 11-207161 | 8/1999 |
| | | | | JP | 11233292 A | 8/1999 |
| | FOREIGN PATENT DOCUMENTS | | | JP | 11-310451 | 11/1999 |
| BN | 11-207161 | 8/1999 | | JP | 2000-124 197 | 4/2000 |
| DE | 94 21 671 | 7/1996 | | JP | 2000-119840 A | 4/2000 |
| EP | 0326318 | 8/1989 | | JP | 2000-124197 | 4/2000 |
| EP | 0 508 731 | 10/1992 | | JP | 2000-303180 | 10/2000 |
| EP | 508731 A2 * | 10/1992 | | JP | 2001-031484 | 2/2001 |
| EP | 0 573 057 | 12/1993 | | JP | 11-312646 | 3/2001 |
| EP | 0 799 904 | 10/1997 | | JP | 2001-152307 | 6/2001 |
| EP | 0 814 495 | 12/1997 | | JP | 2001-164354 | 6/2001 |
| EP | 0 892 083 | 4/1998 | | JP | 2001-226773 | 8/2001 |
| EP | 0 841 838 | 5/1998 | | JP | 2002-134481 | 5/2002 |
| EP | 1 069 603 | 1/2001 | | JP | 2002-151473 | 5/2002 |
| EP | 1 081 749 | 3/2001 | | KR | 1991-002451 | 6/1988 |
| EP | 1 081 749 | 7/2001 | | KR | 1999-0008937 | 9/1994 |
| EP | 1 156 130 | 11/2001 | | KR | 1998-063542 | 10/1998 |
| GB | 2 252 567 | 8/1992 | | KR | 1999-008142 | 1/1999 |
| JP | 59-186325 | 10/1984 | | KR | 1999-13565 | 2/1999 |
| JP | 61-207566 | 9/1986 | | KR | 0167829 | 2/1999 |
| JP | 62-067161 | 3/1987 | | KR | 10-0266840 | 6/2000 |
| JP | 63-000450 | 1/1988 | | KR | 10-0275831 | 9/2000 |
| JP | 64-039728 | 2/1989 | | KR | 2002-0027373 | 4/2002 |
| JP | 1-120328 | 8/1989 | | KR | 10/2004-0007601 | 1/2004 |
| JP | 01-312087 | 12/1989 | | WO | WO 99/50886 | 10/1999 |
| JP | 1-312087 | 12/1989 | | WO | 01/42526 | 6/2001 |
| JP | 02-267967 | 11/1990 | | WO | WO 01/42526 | 6/2001 |
| JP | 03-115535 | 5/1991 | | WO | 02/39495 | 5/2002 |
| JP | 03115535 A * | 5/1991 | | WO | WO 02/39495 | 5/2002 |
| JP | 4-238882 | 8/1992 | | WO | 02/48421 | 6/2002 |
| JP | 04-238882 | 8/1992 | | WO | WO 02/48421 | 6/2002 |
| JP | 05-070922 | 3/1993 | | WO | WO 2004/030011 | 4/2004 |
| JP | 05-117064 | 5/1993 | | WO | WO 2004/030012 | 4/2004 |
| JP | 05121360 | 5/1993 | | WO | WO 2004/030013 | 4/2004 |
| | | | | WO | WO 2004/030014 | 4/2004 |

| WO | WO 2004/030015 | 4/2004 |
| WO | WO 2004/030020 | 4/2004 |
| WO | WO 2004/030426 | 4/2004 |
| WO | WO 2004/095530 | 11/2004 |
| WO | WO 2004/095532 | 11/2004 |

OTHER PUBLICATIONS

JIS Using Series, "Spraying Techniques Manual.", p. 95 (Oct. 30, 1998, Japanese Standard Association), with English Translation.

Production drawing for Deposition Shield, Upper believed to be sold in the U.S. on Apr. 12, 2000.

Production drawing for Deposition Shield believed to be sold in the U.S. prior to Sep. 30, 2001.

Production drawing for Upper Electrode believed to be sold in the U.S. prior to Sep. 30, 2001.

Yousha Gitjutsu Handbook, $1^{st}$ Edition, Japan Thermal Spraying Society, Techno Consultants, Inc., pp. 3, 316-317 (1998) (with partial English translation).

JP Office Action mailed Jul. 6, 2010, in Japanese Patent Application No. 2006-245777 (with English-language translation).

* cited by examiner

| MEMBER | ETCHING AMOUNT (STANDARDIZED VALUE) | REMARKS |
|---|---|---|
| QUARTZ | 6.11 | CONTROL |
| ALUMINUM HAVING AN ANODIC OXIDATION SURFACE | 4.22 | CONTROL |
| ALUMINA (99.9%) | 1.00 | CONTROL |
| $Al_2O_3/Y_2O_3=0.5$ | 0.24 | SPRAYED FILM, PRESENT INVENTION |
| $Al_2O_3/Y_2O_3=0.75$ (YAG) | 0.13 | SPRAYED FILM, PRESENT INVENTION |
| $Y_2O_3$ | 0.4 | SPRAYED FILM, PRESENT INVENTION |
| $Sc_2O_3$ | 0.23 | SPRAYED FILM, PRESENT INVENTION |
| $ScF_3$ | 0.24 | SPRAYED FILM, PRESENT INVENTION |
| $YF_3$ | 0.35 | SPRAYED FILM, PRESENT INVENTION |
| $La_2O_3$ | 0.25 | SPRAYED FILM, PRESENT INVENTION |
| $CeO_2$ | 0.24 | SPRAYED FILM, PRESENT INVENTION |
| $Eu_2O_3$ | 0.24 | SPRAYED FILM, PRESENT INVENTION |
| $Dy_2O_3$ | 0.24 | SPRAYED FILM, PRESENT INVENTION |

FIG. 3

| PRACTICAL STRUCTURE | UPPER LAYER | MIDDLE LAYER | LOWER LAYER |
|---|---|---|---|
| CASE 1 | $NH_3$ | Ar | $TiCl_4$ or $ClF_3$ |
| CASE 2 | Ar | $NH_3$ | $TiCl_4$ or $ClF_3$ |
| CASE 3 | $NH_3$ | $TiCl_4$ or $ClF_3$ | Ar |
| CASE 4 | Ar | $TiCl_4$ or $ClF_3$ | $NH_3$ |
| CASE 5 | $TiCl_4$ or $ClF_3$ | Ar | $NH_3$ |
| CASE 6 | $TiCl_4$ or $ClF_3$ | $NH_3$ | Ar |
FIG. 15
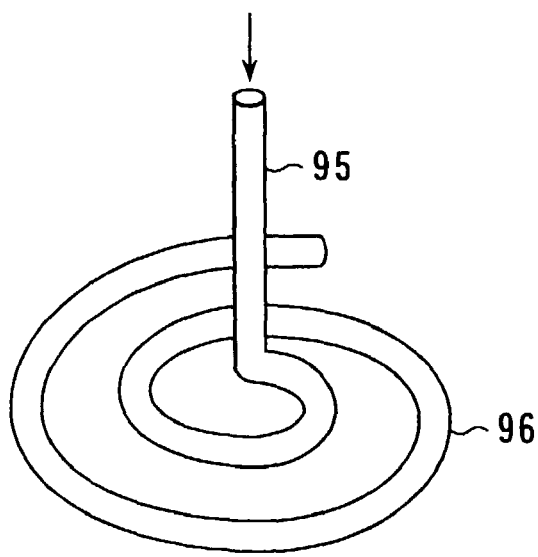
FIG. 16
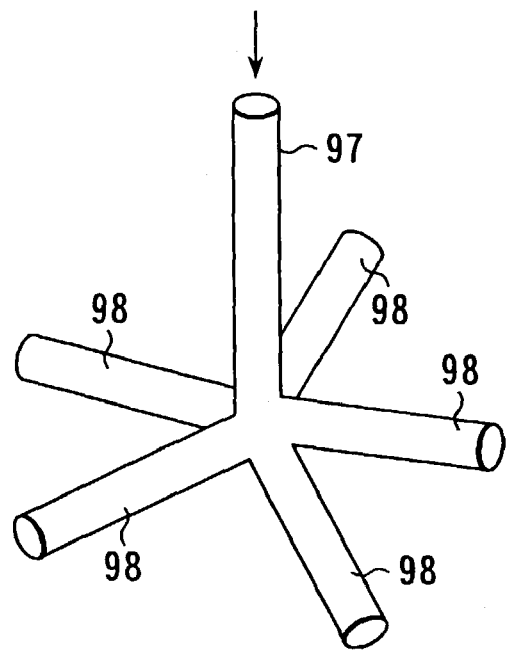
FIG. 17

PROCESSING APPARATUS WITH A CHAMBER HAVING THEREIN A HIGH-CORROSION-RESISTANT SPRAYED FILM

CROSS-REFERENCE TO RELATED APPLICATIONS

This application is based upon and claims the benefit of priority from the prior Japanese Patent Application No. 11-352018, filed Dec. 10, 1999, the entire contents of which are incorporated herein by reference.

BACKGROUND OF THE INVENTION

A present invention relates to a processing chamber having a mounted chamber having a high-corrosion-resistant film and applied to a film forming apparatus, heat processing apparatus and etching apparatus as used in a CVD (Chemical Vapor Deposition), etc.

In response to a recent demand for a high density and high integration unit, a semiconductor device is progressed from a two-dimensional connection structure toward a three-dimensional multi-connection structure. For this reason, the burying technique for electrical interlayer connection using a contact hole for connection between an underlying circuit element and an overlying connection layer and a via hole for connection between an underlying connection layer and an overlying connection layer, and so on, is becoming important. For the burying of the contact hole and via hole, use is made of Al (aluminum), W (tungsten) or an alloy including these as a main component.

At the burying step using aluminum or aluminum alloy, a heating step and so on are involved during a manufacture. If the aluminum connection line and underlying silicon (Si) substrate are directly contacted with each other, there is a risk that there will occur a "Si-sucking-up" effect of aluminum, etc., at its boundary area and an alloy will be newly formed there. The alloy thus formed is greater in the value of a resistance and is not desirable from the standpoint of a power saving and high-speed operation demanded of a resultant device. Further, when tungsten or tungsten alloy is used as a burying layer in the contact hole, $WF_6$ gas intrudes into the silicon substrate, thus offering a possibility of deteriorating the electrical characteristic, etc., of the device. This is, therefore, not preferable.

In order to prevent the occurrence of such a problem, a barrier layer is formed on the bottom and inner wall of the hole before forming a buried layer in the contact hole or via hole and then such a buried layer is formed. Generally, a TiN film is known as a barrier layer.

With a trend toward the high-density integration, on the other hand, a high dielectric constant material such as $Ta_2O_5$ is used as a capacitor gate material to obtain a higher capacitance without changing its scale. However, such a higher dielectric constant material is not stabler in characteristic than $SiO_2$ conventionally used as the capacitor gate material. If a poly-Si is used on the overlying electrode, it is oxidized due to the chemical reaction after the formation of the capacitance, thus failing to manufacture a device element of stable characteristics. It is, therefore, necessary that a less-oxidized TiN film be used as an overlying electrode.

The TiN film has been formed by using a physical vapor deposition (PVD) technique and a demand has been made for a finer and higher integration device in particular. In addition, the design rules are particularly stringent. Hence, in PVD that can hardly achieve high coverage. Therefore, a chemical vapor deposition (CVD) technique is used by which it is possible to form a TiN film of a better quality. Stated in more detail, a thermal CVD is used, in which $TiCl_4$ and $NH_3$ (ammonia) or MMH (monomethylhydrazine) is applied, as a reaction gas, to a heated substrate. In the case where the TiN film is formed by such a thermal CVD, chlorine is liable to be retained in a formed film, thus presenting a problem. The retaining of such chlorine results in a higher specific resistance and it is not possible to obtain a proper characteristic if the film is applied to an electrode overlying a capacitor.

Further, the TiN film, being a columnar crystal, is liable to be boundary-diffused and involves a lower barrier characteristic. The lower barrier characteristic presents a problem in the case where the TiN film is used as a barrier layer for a Cu connection line or an oxygen diffusion barrier for $Ta_2O_5$ connection line of an electrode overlying the capacitor. That is, a problem occurs due to the corrosion of the Cu connection line by the residual chlorine or a lowering of a capacitance of $Ta_2O_5$ by the diffusion of oxygen.

An amount of Cl in the formed film can be indeed reduced by making a film formation temperature higher. However, a high temperature process is not preferable due to a problem, such as thermal resistance and the corrosion, of a connection line material such as Cu and Al.

As one technique of plasma CVD, there is an ICP (Inductively Coupled Plasma)—CVD according to which an antenna member such as a coil is provided around a bell jar (chamber). By applying a high frequency power to it, an inductive electromagnetic field is created to provide plasma. In the case where the TiN film is formed using this technique, the formed TiN film becomes low-resistance and low in chlorine, and even a film formed at a relatively low temperature is made low in an amount of residual chlorine.

Although a chamber made of quartz or alumina is used in the formation of the TiN film by the ICP-CVD, it is not good in a plasma-resistant characteristic and a corrosion resistance to an etching gas such as $ClF_3$ used for cleaning the interior of the apparatus after the formation of the TiN film is not better, thus presenting a problem.

Further, in this type of CVD film formation apparatus, a deposit is formed on the inner wall of the chamber due to the introduction of a process gas from above the chamber and a foreign deposit is liable to be formed. In the case of forming the TiN film, the plasma created is attenuated due to the deposit of a conductive film on the inner wall of the upper chamber, thus making it difficult to form a film.

BRIEF SUMMARY OF THE INVENTION

An object of the present invention is to provide a processing apparatus having a chamber applied to a film forming apparatus, heat processing apparatus and etching apparatus and having a high-corrosion-resistant property and less liable to deposit a product by a process gas or a product, such as an etching product, on its inner wall thereof.

The thus constructed processing apparatus has a mounted chamber holding a to-be-processed substrate and having members for work-processing the substrate by any of heating, plasma, process gas or a combination thereof, in which a film of $Al_2O_3$ and $Y_2O_3$ is formed on the inner wall surface of the chamber and on the exposed surfaces of the members within the chamber, the $Al_2O_3/Y_2O_3$ weight ratio being above 0.5. The $Al_2O_3/Y_2O_3$ weight ratio is in a range above 0.5 but below 4. The thickness of the formed film is above 50 μm.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a view showing a relation of members in an etching time to an etched amount;

FIG. 15 is a view showing practical structures of head section;

FIG. 16 is a perspective view showing a first modified structure of a gas discharge member;

FIG. 17 is a perspective view showing a second modified structure of a gas discharge member;

DETAILED DESCRIPTION OF THE INVENTION

The embodiments of the present invention will be described below with reference to the accompanying drawings.

Figure 1:
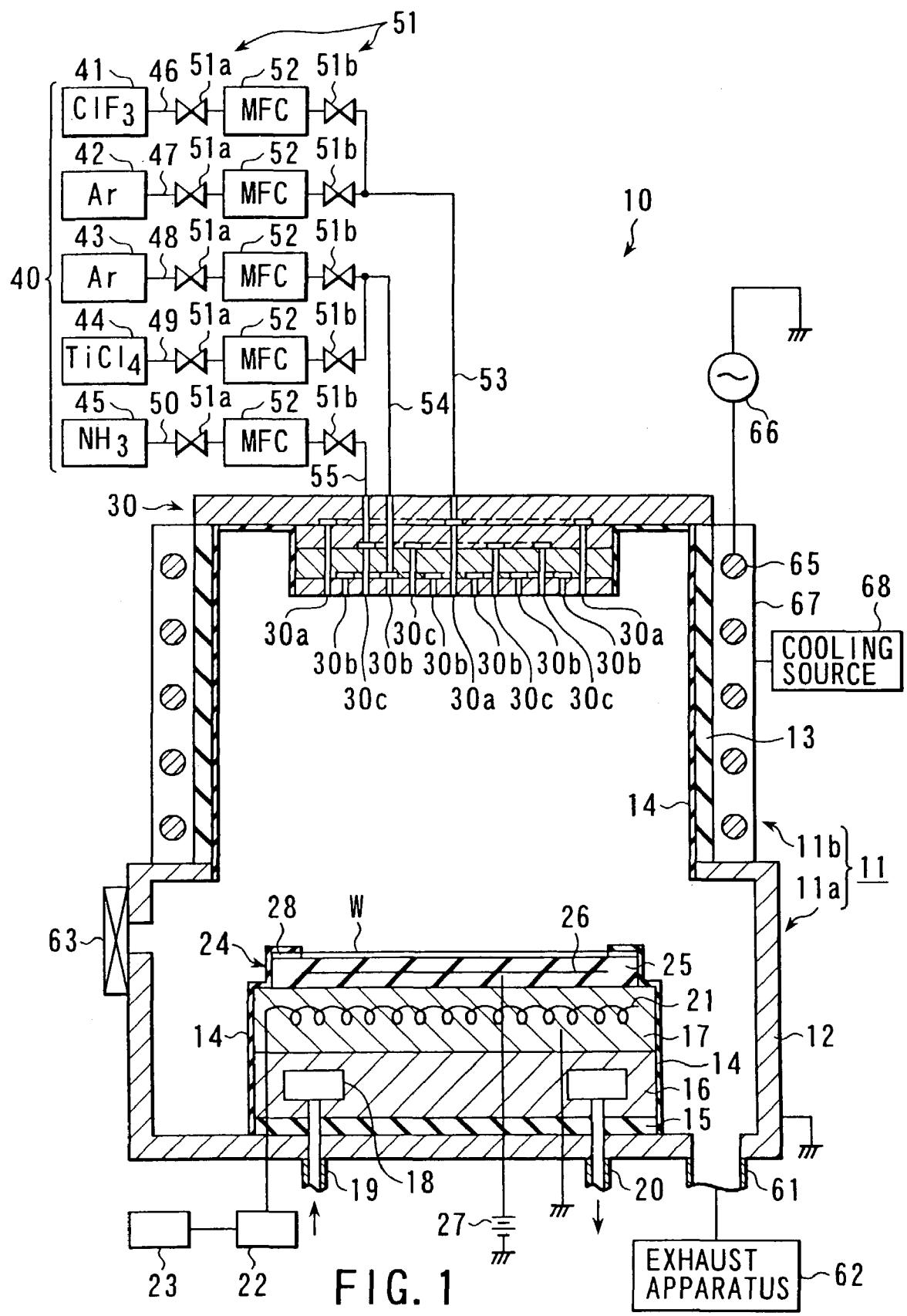
FIG. 1 is a view showing a practical structure of a plasma CVD apparatus according to a first embodiment of the present invention.

FIG. 1 is a cross-sectional view showing a practical example applied to a CVD film forming apparatus as a first embodiment of the present invention in a processing apparatus having a mounted chamber having a high corrosion-resistant thermal sprayed film.

The film forming apparatus of the present invention is directed to forming, for example, a TiN thin film. The film forming apparatus 10 includes a chamber 11 having a lower chamber 11a and upper chamber 11b formed as an integral unit in a hermetically sealable way. The upper chamber 11b is made smaller in diameter than the lower chamber 11a. The lower chamber 11a is comprised of an electric conductor 12, such as aluminum, whose surface is anadigation processed for example. The upper chamber 11b comprises a base material 13 of, for example, a ceramic material and a sprayed film 14. The film 14 may contain oxide of Y, Sc, La, Ce, Eu, $Dy_2O_3$ or the like, or fluoride of one of these metals. The film 14 may be made of a compound of a III-b element of the periodic table, such as $Y_2O_3$. Needless to say, the film 14 may be made of such a compound and any other material. In the present invention, the film 14 is a sprayed film that substantially comprises $Al_2O_3$ and $Y_2O_3$. As the material of the chamber use can be made of ceramic ($Al_2O_3$, $SiO_2$, MN etc.,), aluminum or stainless steel, metal or metal alloy.

A weight ratio of $Al_2O_3/Y_2O_3$ of the sprayed film 14 is preferably 0.5 to 4. It is to be noted that FIG. 8 simply shows data of the weight ratio of up to 1.5. In the formation of the sprayed film 14 it may be possible to spray an $Al_2O_3$ and $Y_2O_3$ compound or to spray, for example, yttrium-aluminum-garnet (YAG) in a composite oxide state of the above-mentioned composition range. The thickness of the sprayed film is based on the insulation withstand characteristic for plasma generation and, from the standpoint of the breakdown voltage characteristic shown in, for example, FIG. 2, may be of the order of at least 50 μm and preferably of the order of 50 μm but not above 300 μm from the standpoint of a manufacturing process and cost.

The ceramics of the base material 13 may be $Al_2O_3$, $SiO_2$, such as silica glass and quartz, AlN, alternatively, rigid plastic may be used, and, here, the sprayed film as set out above is not formed on the inner wall of the upper chamber 11b but it may be formed there.

On the inner bottom of the lower chamber 11a an insulating plate 15 of ceramic, etc., and support base 16 are provided and a substantially cylindrical susceptor 17 is provided on the support base 16 to place a semiconductor wafer (hereinafter referred to as a wafer) as a to-be-processed object on it.

A coolant chamber 18 is provided in the interior of the support base 16 to receive the coolant via a coolant introducing tube 19. The coolant is discharged out of a discharge tube 20. Through such a circulation, a cold is conducted through the susceptor 17 to the wafer W. A heating element 21 is buried in the susceptor 17 to heat the wafer W to a predetermined temperature by supplying power from a power source 22. To the power source 22, a controller 23 is connected. And the temperature of the wafer W is controlled by a cold of the coolant and heat of the heating element.

At the susceptor 17, an electrostatic chuck 24 is provided which is substantially the same in configuration as the wafer W. The electrostatic chuck 24 is so formed as to have an electrode 26 buried in an insulating material 25. The wafer W is electrostatically attracted by a Coulomb force, etc., generated by applying a DC voltage from a DC power source 27 to the electrode 26. At the outer peripheral portion of an upper surface of the electrostatic chuck 24 an area for achieving the uniformity of a film formation, for example, a focusing ring 28 is provided to surround the wafer W. The above-mentioned sprayed film 14 is formed on those exposed surfaces of the support base 16, susceptor 17, electrostatic chuck 24 and focusing ring 28 within the chamber.

A shower head member 30 is provided above the chamber 11b. In the shower head member 30, many gas discharge holes 30a (Ar, ClF$_3$), 30b (Ar, TiCl$_4$) and 30c (NH$_3$) are alternately formed to discharge gases in a down direction within the chamber. The pipes of a gas supply system 40 are connected to the shower head member 30. That is, as will be set out below, a pipe 55 for supplying a gas (Ar, ClF$_3$) is connected to the gas discharge holes 30a, a pipe 56 for supplying a gas (Ar, TiCl$_4$) is connected to the gas discharge holes 30b and a pipe 57 for supplying a gas (NH$_3$) is connected to the gas discharge holes 30c. By doing so, the respective gases are introduced through the shower head member 30 into the upper chamber 11b.

The shower head member 30 is comprised of, for example, a three-layers-stacked structure of three gas dispersion plate and has discharge plate having the gas discharge holes. The respective gas discharge plate has a groove and holes for allowing one kind of gas to be dispersed evenness to a whole gas discharge surface area in the head. In particular, the discharge holes of the gas dispersion plate are so formed as not be overlapped with the discharge holes of the other gas dispersion plate. Though being not illustrated in the Figure, the gas discharge holes are arranged in a matrix array upon viewing the gas discharge hole surface side from below. And a post-mixing system is adopted according to which TiCl$_4$ gas and NH$_3$ gas are discharged from the alternately formed different discharge holes and these gases are mixed as a process gas after being discharged.

The gas supply system 40 has a ClF$_3$ supply source 41 for supplying ClF$_3$ as a cleaning gas, Ar supply sources 42 and 43 for supplying Ar, a TiCl$_4$ supply source 44 for supplying TiCl$_4$ as a process gas and an NH$_3$ supply source 45 for supplying NH$_3$ as a process gas. A gas line 46 is connected to the ClF$_3$ supply source 41, gas lines 47 and 48 are connected to the Ar supply sources 42 and 43, respectively, a gas line 49 is connected to the TiCl$_4$ supply source 44 and a gas line 50 is connected to the NH$_3$ supply source 45. A valve 51 (51a, 51b) and mass flow controller 52 are provided at these gas lines.

Into the gas line 47 extending from the Ar supply source 42, the gas line 46 extending from the ClF$_3$ supply source 41 is joined and the gas line 46 extending form the ClF$_3$ supply source 41 is joined. The gas line 46 extending form the ClF$_3$ supply source 41 is joined into a gas line 53. By opening the valve 51 provided on the gas line 46, ClF$_3$ serving as a cleaning gas is passed through the gas line 46 and pipe 53 and reaches the shower head 30 to allow it to be introduced via the gas discharge holes 30a into the upper chamber 11b. Needless to say, there is the case where Ar alone is supplied from the Ar supply source 42.

Into the gas line 48 extending from the Ar supply source 43, the gas line 49 extending from the TiCl$_4$ supply source 44 is joined. TiCl$_4$ gas passed through the gas line 49 and pipe 54 is carried by the argon gas and reaches the shower head 30. The TiCl$_4$ gas is introduced from the gas discharge holes 30b into the chamber 11.

Further, the NH$_3$ gas is supplied from the NH$_3$ supply source 45 past the gas line 50 and pipe 55 to the shower head 30 and introduced from the gas discharge holes 30c into the upper chamber 11b. It is to be noted that, in place of NH$_3$, monomethylhydrazine (MMH) may be used.

At the bottom wall of the lower chamber 11a the exhaust tube 61 is provided which is connected to an exhaust apparatus 62 including a vacuum pump. By operating the exhaust apparatus 62 it is possible to reduce pressure in the chamber 11 to a predetermined vacuum level. A gate valve 63 is provided at the sidewall of the lower chamber 11a and, in its open state, allows the wafer W to be passed into and out of an outside, for example, an adjacent load lock chamber, not shown.

A coil 65 as an antenna member is wound around the upper chamber 11b and a high frequency power source 66 is connected to the coil 65. The high frequency power source 66 has a frequency of, for example, 13.65 MHz. By supplying a high frequency power from the high frequency power source 66 to the coil 65 an inductive electromagnetic field is created within the upper chamber 11b. Further, a cooling mechanism 67 using a cooling medium such as a coolant and a cooling source 68 for driving this are provided.

With this apparatus, the gate valve 63 is opened and, in its open state, a wafer W is loaded into the chamber 11 and placed onto the electrostatic chuck 24. The wafer W is attracted to the electrostatic chuck 24 by applying a voltage to the electrode 26. Thereafter, the gate valve 63 is closed, and the interior of the chamber 11 is evacuated by the exhaust system 62 to a predetermined vacuum level. Then, while introducing an Ar gas from the Ar supply source 42 into the chamber 11, a high frequency power is supplied from the high frequency power source 66 to the coil 65 to create an inductive electromagnetic field within the upper chamber 11b. Plasma is generated under this high frequency electric field.

Then, a predetermined amount of NH$_2$ gas and TiCl$_4$ gas are introduced into the upper chamber 11b from the NH$_3$ supply source 45 and TiCl$_4$ supply source 44 to generate plasma and are brought to the lower chamber 11a side. By this plasma, a TiN thin film is formed onto the wafer W. At this time, the formation of the TiN thin film is effected at a temperature of about 300 to 450° C. by controlling an output to the heating element 21 and an amount of flow of a coolant. After the film formation, the wafer W is unloaded out of the chamber 11 and the ClF$_3$ gas serving as a cleaning gas is introduced into the chamber 11 to clean the interior of the chamber.

In the above-mentioned processing, the inner wall of the upper chamber 11b is attacked by the plasma generated in the upper chamber 11b and exposed to the ClF$_3$ gas (etching gas) at a cleaning time. Under such an environment, no adequate corrosion resistance was not obtained in a conventional chamber made of quartz and Al$_2$O$_3$ with the resultant disadvantage of a short life. According to the present invention, however, use is made mainly of Al$_2$O$_3$ and Y$_2$O$_3$ and a high-corrosion-resistant sprayed film 14 having Al$_2$O$_3$/Y$_2$O$_3$ weight ratio of above 0.5 is formed on the inner wall of the upper chamber 11b. Hence, even if being contacted with plasma and cleaning gas, the inner wall of the chamber is less likely to be etched and ensures a longer service life.

The sprayed film 14 has insulating property because it contains 6 a III-a group element of the periodic table. Use can be made of, as the basic material, various kinds of materials such as ceramic herein used, aluminum, stainless steel, rigid plastic (engineering plastic) etc. Further, the sprayed film 14 is lower in cost than a sintered product and has a greater merit of forming a film for a short period of time. It is to be noted that such sprayed film may be formed on the inner wall of the lower chamber 11a and can enhance a corrosion resistance of the lower chamber 11a.

An explanation will be made below about the results of experiments by which the corrosion resistance of the sprayed film is confirmed. Here, a parallel flat type plasma etching apparatus was used by way of example. A sprayed film was irradiated, with plasma, at an intra-chamber pressure of 133.3 Pa (1000 m Torrs) and a gas flow rate of $CF_4:Ar:O_2=95:950:10$ (a total flow rate of 1.055 L/min (1055 sccm)) for 20 hours through the application of a high frequency power of 13.56 MHz at 1300 W.

Figure 2A:
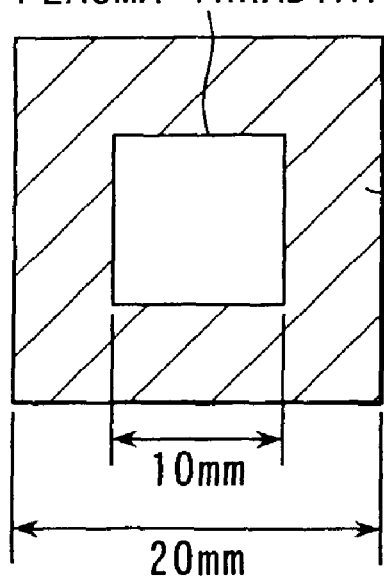
FIGS. 2A and 2B are views showing a sample of a test by etching and evaluation standard.
Figure 2B:
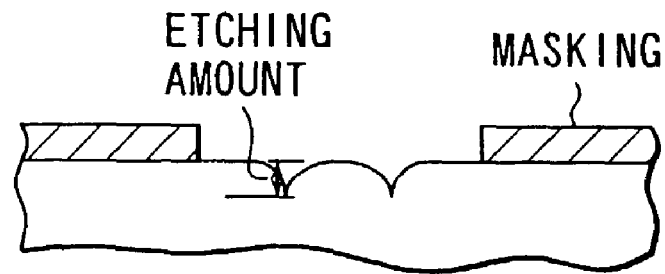

Surface-polished samples were used, each comprised a 20×20×2 mm aluminum base, a 200 μm-thick first sprayed film made of $Al_2O_3$ and $Y_2O_3$ and formed on the aluminum base, and a 200 μm-thick second sprayed film made of $Y_2O_3$, $Sc_2O_3$, $ScF_3$, $YF_3$, $La_2O_3$, $CeO_2$, $Eu_2O_3$ and $Dy_2O_3$. Stated in more detail, as the sprayed film made of $Al_2O_3$ and $Y_2O_3$, a sprayed film having a weight ratio of $Al_2O_3/Y_2O_3=0.5$ and a film sprayed with a 99.9%-purity YAG ($Y_3Al_5O_{12}$: a weight ratio of $Al_2O_3/Y_2O_3=0.75$) was used. As shown in FIG. 2A, the sample was, while leaving a central area of 10 mm square, masked at its outer peripheral area with a polyimide film and irradiated with plasma. And a plasma-resistant property was evaluated with an etched amount. The etched amount was evaluated with its depth, as shown in FIG. 2B, with the use of a surface roughness meter. For comparison, samples of other materials were also evaluated in terms of the corrosion-resistant property. The result of evaluation is as shown in FIG. 3. Here, the etched amount is shown with the etched amount of alumina standardized as "1".

It was confirmed that, as shown in FIG. 3, the films containing a III-a element of the periodic table had higher corrosion resistance to plasma than the other materials. Of these films, the sprayed film made of $Al_2O_3$ and $Y_2O_3$ exhibited a particularly high corrosion resistance since it was of YAG composition.

Figure 4:
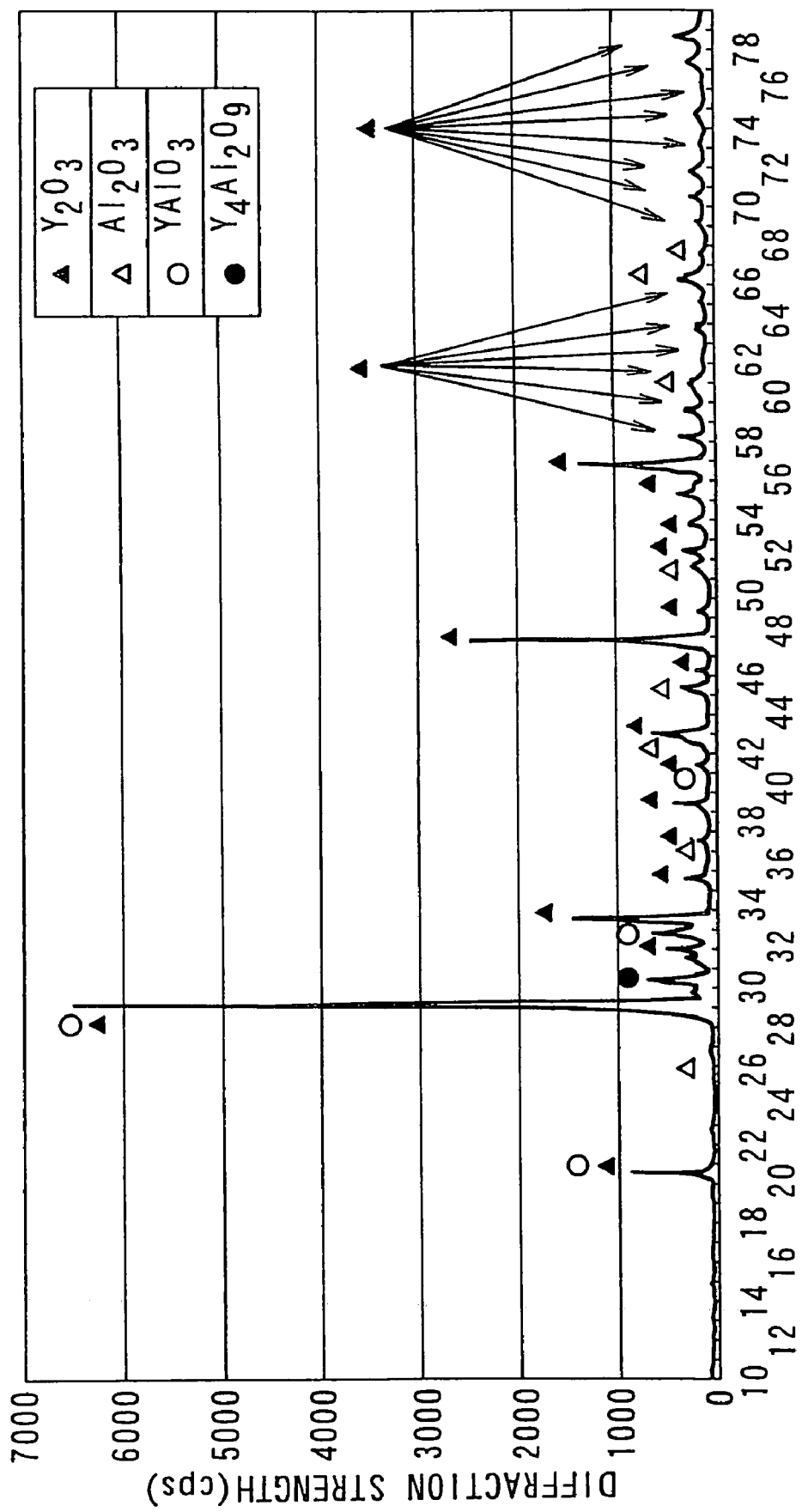
FIG. 4 is a view showing an X-ray diffraction pattern of a sprayed film when an $Al_2O_3/Y_2O_3$ weight ratio=0.43.
Figure 5:
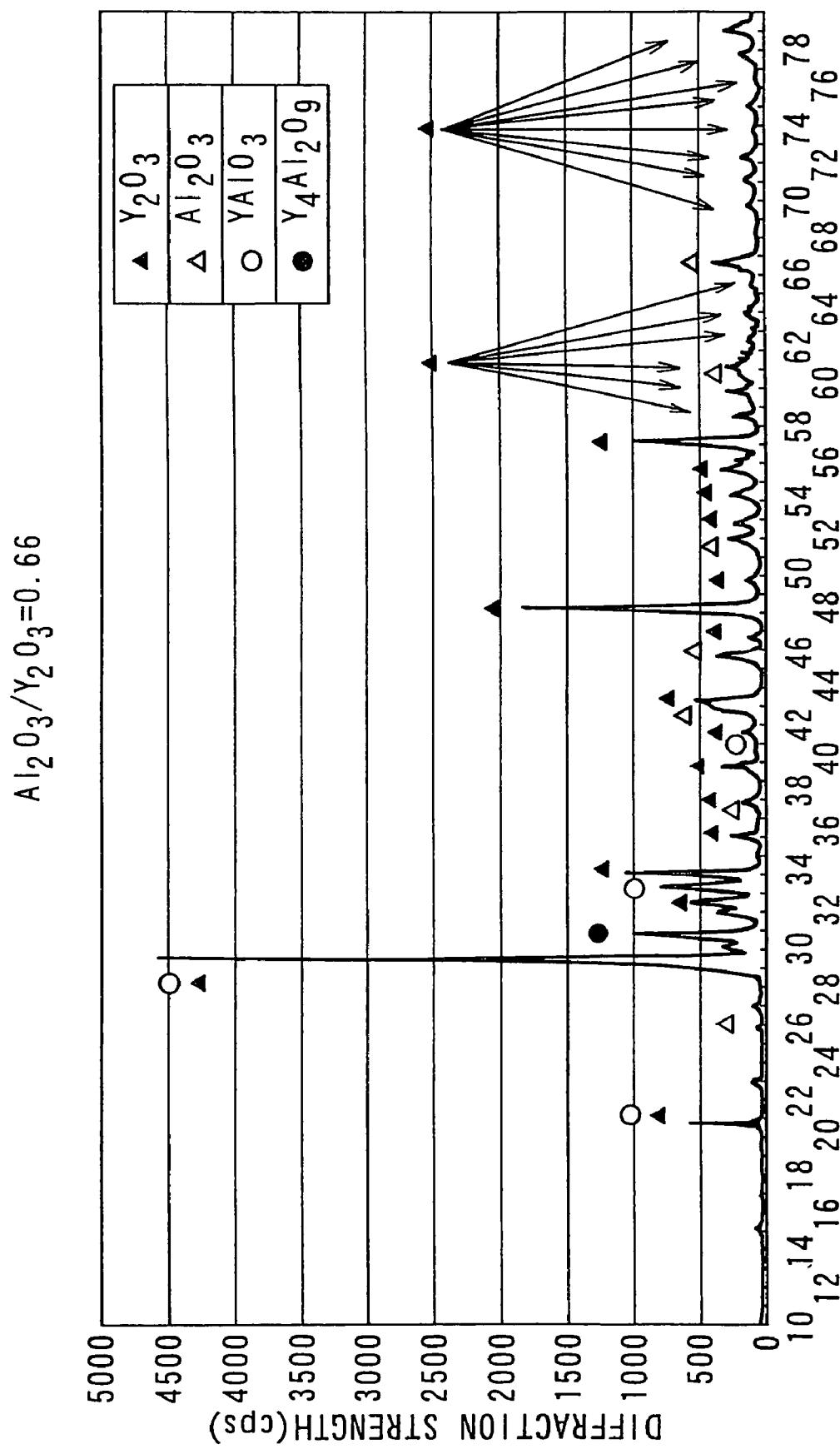
FIG. 5 is a view showing an X-ray diffraction pattern of a sprayed film when an $Al_2O_3/Y_2O_3$ weight ratio=0.66.
Figure 6:
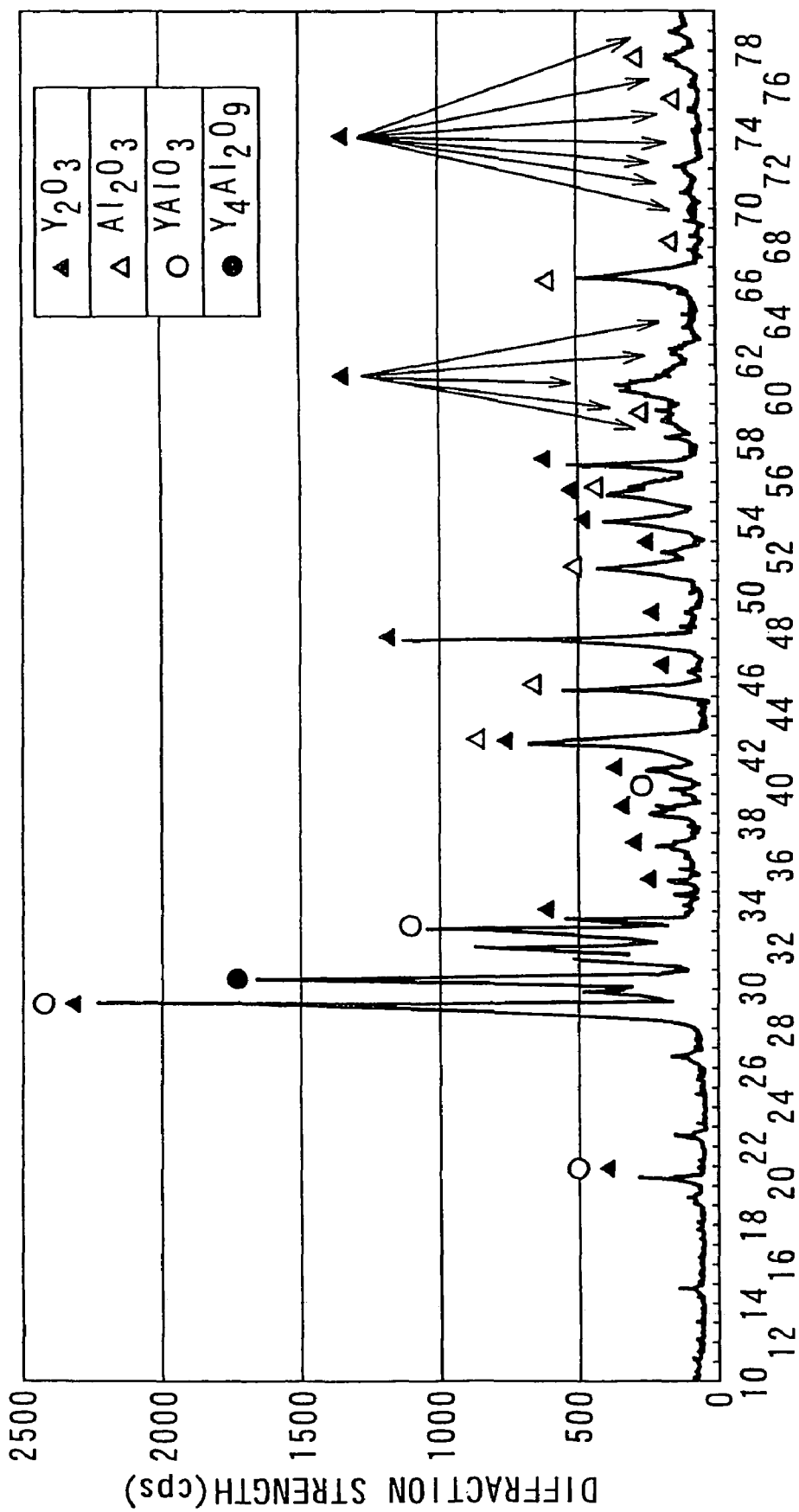
FIG. 6 is a view showing an X-ray diffraction pattern of a sprayed film when an $Al_2O_3/Y_2O_3$ weight ratio=1.50.
Figure 7:
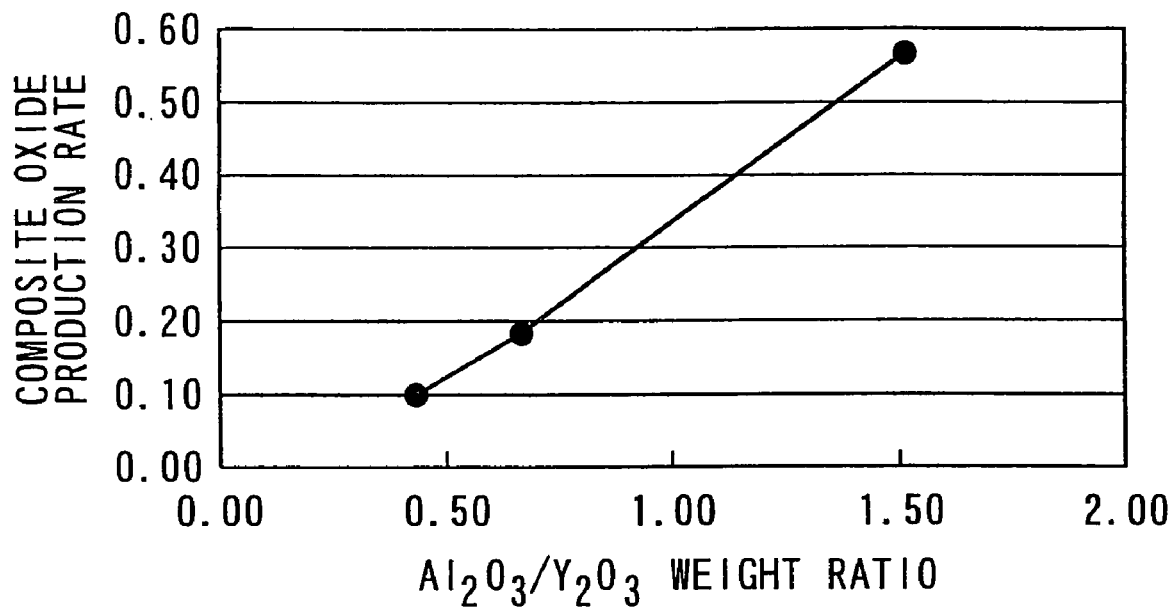
FIG. 7 is a view showing a rate of a composite oxide when the $Al_2O_3/Y_2O_3$ weight ratio of a sprayed film varies.

Then, with an $Al_2O_3/Y_2O_3$ weight ratio set to 0.43, 0.66, and 1.5, these mixed powders were sprayed onto an aluminum basic material to form a sprayed film. FIGS. 4, 5 and 6 show and X-ray diffraction pattern each. As shown in these figures, for any of the sprayed films, diffraction peaks corresponding to the $Al_2O_3$ and $Y_2O_3$ crystals are dominant but the diffraction peaks of composite oxides, such as $YAlO_3$ and $Y_4Al_2O_9$ were also confirmed. It is found that the producing rate of these composite oxides is increased with an increase in the weight ratio of $Al_2O_3/Y_2O_3$ as shown in FIG. 7.

Figure 8:
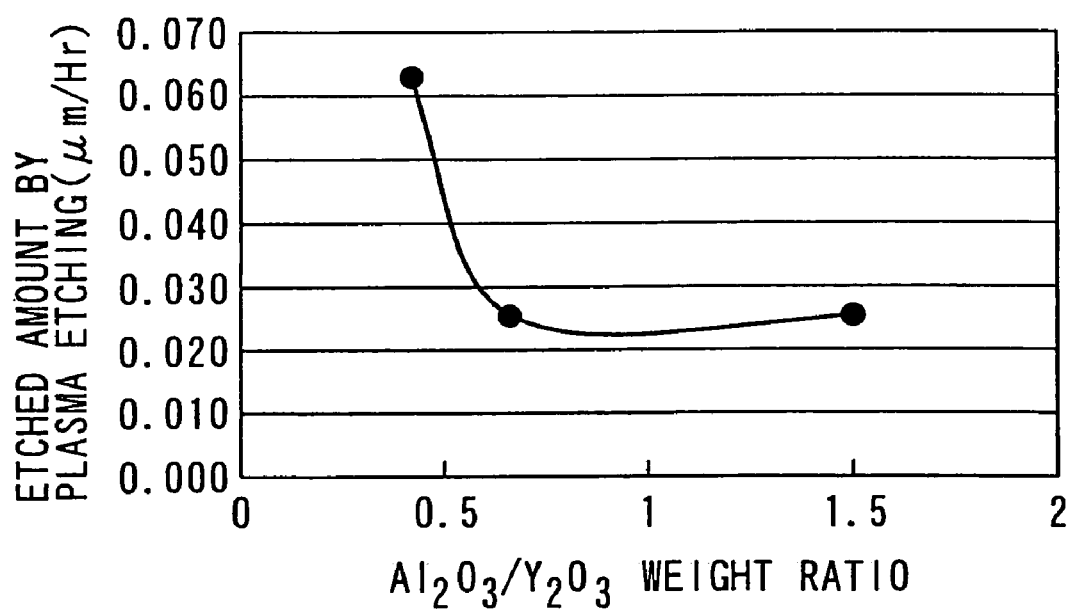
FIG. 8 is a view showing a relation of an $Al_2O_3/Y_2O_3$ weight ratio of a sprayed film to an etched amount.

In the same way as set out above, these samples were tested for corrosion resistance to plasma. The evaluation of the etched amount was made by measuring its depth at a central portion of the above-mentioned 10 mm square portion except the edge portion. The result is as shown in FIG. 8. From this Figure it is found that, with an $Al_2O_3/Y_2O_3$ weight ratio of above 0.5, the corrosion resistance is better. Since, as set out above, with an increase in the weight ratio of $Al_2O_3/Y_2O_3$, the production rate of the composite oxide is increased, there is a possibility that the composite oxide contributes to the corrosion resistance.

Figure 9:
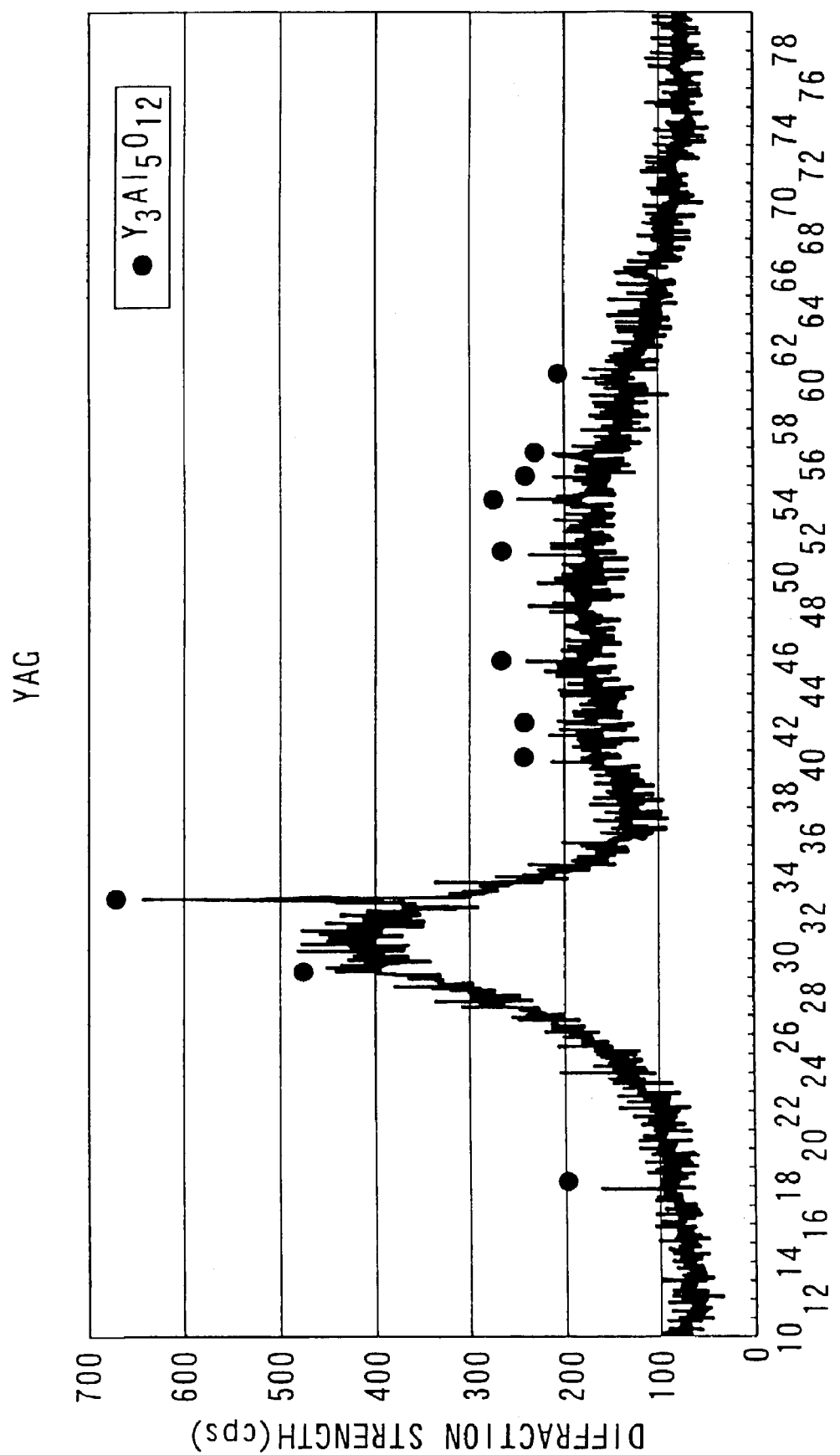
FIG. 9 is a view showing an X-ray diffraction pattern of a sprayed film when sprayed is made using a YAG.

On the other hand, the YAG sprayed film evaluated for the corrosion resistance at the first test was substantially amorphous as shown in FIG. 9.

From this it may be considered that the corrosion resistance is improved by making the sprayed film amorphous.

A second embodiment of the present invention will be explained below.

Figure 10:
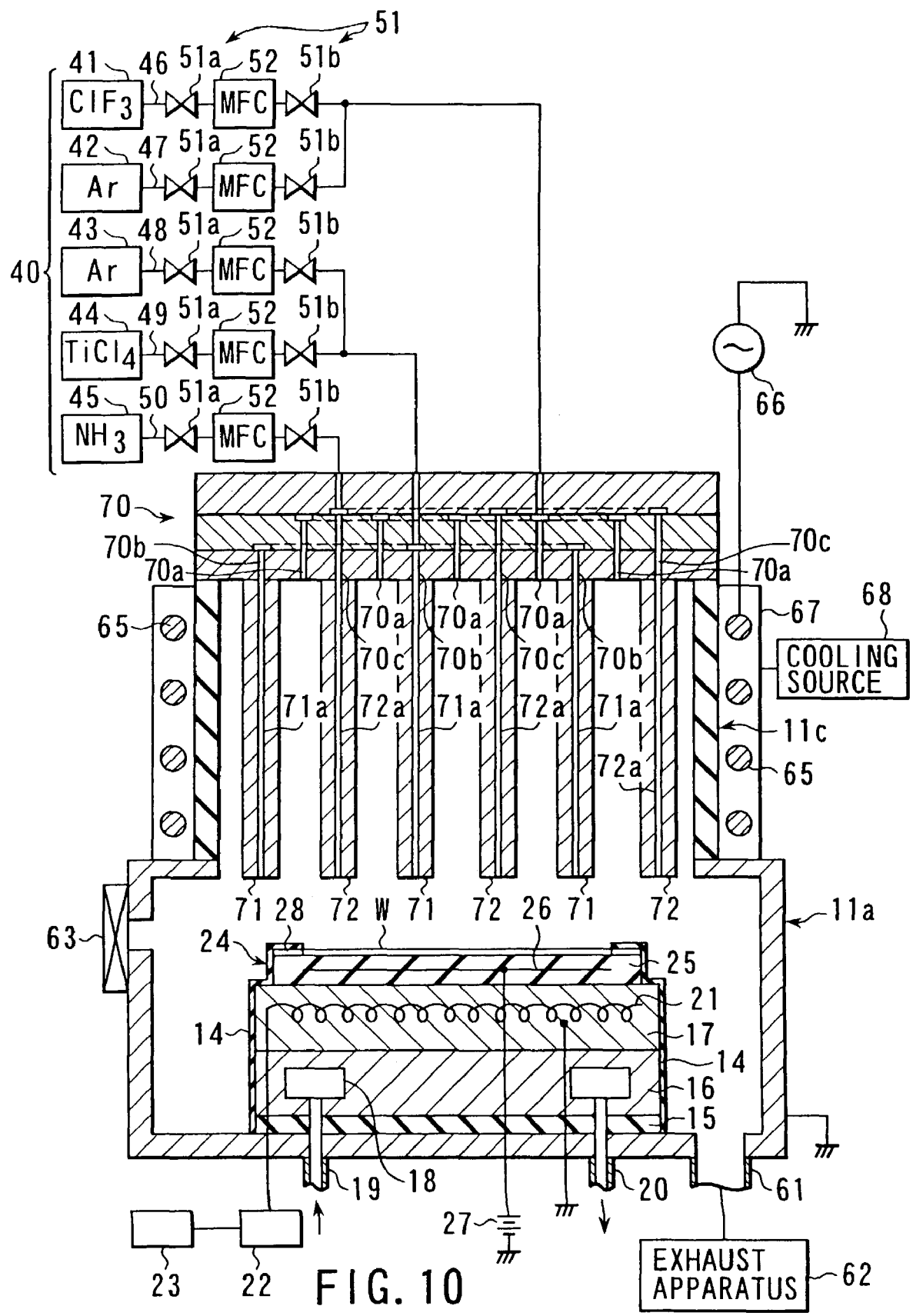
FIG. 10 is a view showing a practical form of a plasma CVD apparatus according to a second embodiment.

FIG. 10 is a cross-sectional view showing a CVD apparatus according to the second embodiment. In this embodiment, a chamber, shower head and gas supply system are different in structure from those of the first embodiment. In this Figure, the same reference numerals are employed to designate parts or elements corresponding in structure to those shown in FIG. 1 and any further explanation is, therefore, omitted.

In this apparatus, an upper chamber 11c is provided above a lower chamber 11a and it is made of a ceramic material, such as $Al_2O_3$, $SiO_2$ and AlN. At a shower head member 70 of pipe type provided at the top of the upper chamber 11c, gas discharge holes 70a, 70b and 70c are alternately formed to discharge gases toward a lower zone within the chamber. A gas supply system 40a comprises gas supply sources and valves 51 and mass flow controllers 52 as in the case of the gas supply system 40 as set out above. This embodiment is different from the first embodiment with respect to a pipe array from the gas supply system 40 to the shower head member 70.

That is, the pipes of the gas supply system 40 are connected to the shower head member 70. As will be set out below, a pipe 81 for supplying an Ar gas and $ClF_2$ gas is connected to the gas discharge holes 70a, a pipe 82 for supplying a $TiCl_4$ gas and Ar gas is connected to the gas discharge holes 70b, and a pipe 83 for supplying an $NH_3$ gas is connected to the gas discharge holes 70c. Pipe-like gas discharge members 71 and 72 extending from the upper chamber 11c toward the upper zone of the lower chamber 11a are connected to the gas discharge holes 70b and 70c. A gas discharge hole 71a is formed in the gas discharge member 71 and a gas discharge hole 72a is formed in the gas discharge member 72.

A gas line 47 extending from an Ar supply source 42 and gas line 46 extending from a $ClF_3$ supply source 41 are connected to the pipe 81. The Ar gas and $ClF_3$ gas are introduced from the pipe 81 into the upper chamber 11c via the gas discharge hole 70a, noting that the Ar gas alone is sometimes supplied there.

A gas line 49 extending from a $TiCl_4$ supply source 44 and gas line 48 extending from an Ar supply source 43 are connected to the pipe 82. The $TiCl_4$ gas using an Ar gas as a carrier gas is introduced from the pipe 82 through the gas discharge hole 70b and gas discharge hole 71a in the gas discharge member 71 into the upper zone of the lower chamber 11a. A gas line 50 extending from an $NH_3$ supply source 43 is connected to the pipe 83 and the $NH_3$ gas is introduced from the pipe 83 through a gas discharge hole 70c and gas discharge hole 72a in the gas discharge member 72 into the upper zone of the lower chamber 11a.

Thus, the $TiCl_4$ gas and $NH_3$ gas are supplied directly into the upper zone of the lower chamber 11a without passing through the upper chamber 11c. After so discharged, these gases are mixed within the lower chamber 11a. The gas line 46 extending from the $ClF_3$ supply source 41 is joined into the gas line 81 and, by opening a valve 51 on the gas line 46, the $ClF_3$ as a cleaning gas is supplied past the gas line 46 and then the pipe 81 to the shower head 70 to allow the $ClF_3$ gas to be introduced via the discharge hole 70a into the upper chamber 11c.

In the thus structured CVD apparatus, a wafer W is loaded into the chamber 11 and the Ar gas as a plasma generation gas is introduced via the gas discharge holes 70a in the shower head into the upper chamber 11c. By supplying a high frequency power from a high frequency power source 66 to a coil 65, an inductive electromagnetic field is created within the upper chamber 11c to generate a plasma of the Ar gas.

On the other hand, the $TiCl_4$ gas and $NH_3$ gas serving as a process gas are directly introduced into the upper zone of the lower chamber 11a via the discharge members 71 and 72 and these gases are excited by the plasma of the Ar gas diffused from the upper chamber 11c into the lower chamber 11a. By doing so, the gases generate a plasma at the upper zone of the lower chamber 11a, so that a reaction occurs on the surface of the wafer W to form a TiN thin film on the wafer.

Even in this embodiment, the film-formed semiconductor wafer is externally unloaded out of the chamber 11 and a $ClF_3$ gas serving as a cleaning gas is introduced into the chamber 11 to clean the inner wall of the chamber.

In this embodiment, as set out above, the Ar gas alone for plasma generation is supplied into the upper chamber 11c and the $TiCl_4$ gas and $NH_3$ gas, serving as a process gas, are supplied directly into the lower chamber 11a via the gas discharge members 71 and 72, so that the process gas almost never reaches the inner wall of the upper chamber 11c. As a result, almost no deposit resulting from the process gas is formed on the inner wall of the upper chamber 11c.

Thus, unlike the prior art technique, a conductive film is not deposited, by the process gas, on the inner wall of the chamber and it is never difficult to form a film under the attenuation of plasma involved.

A third embodiment of the present invention will be described below.

Figure 11:
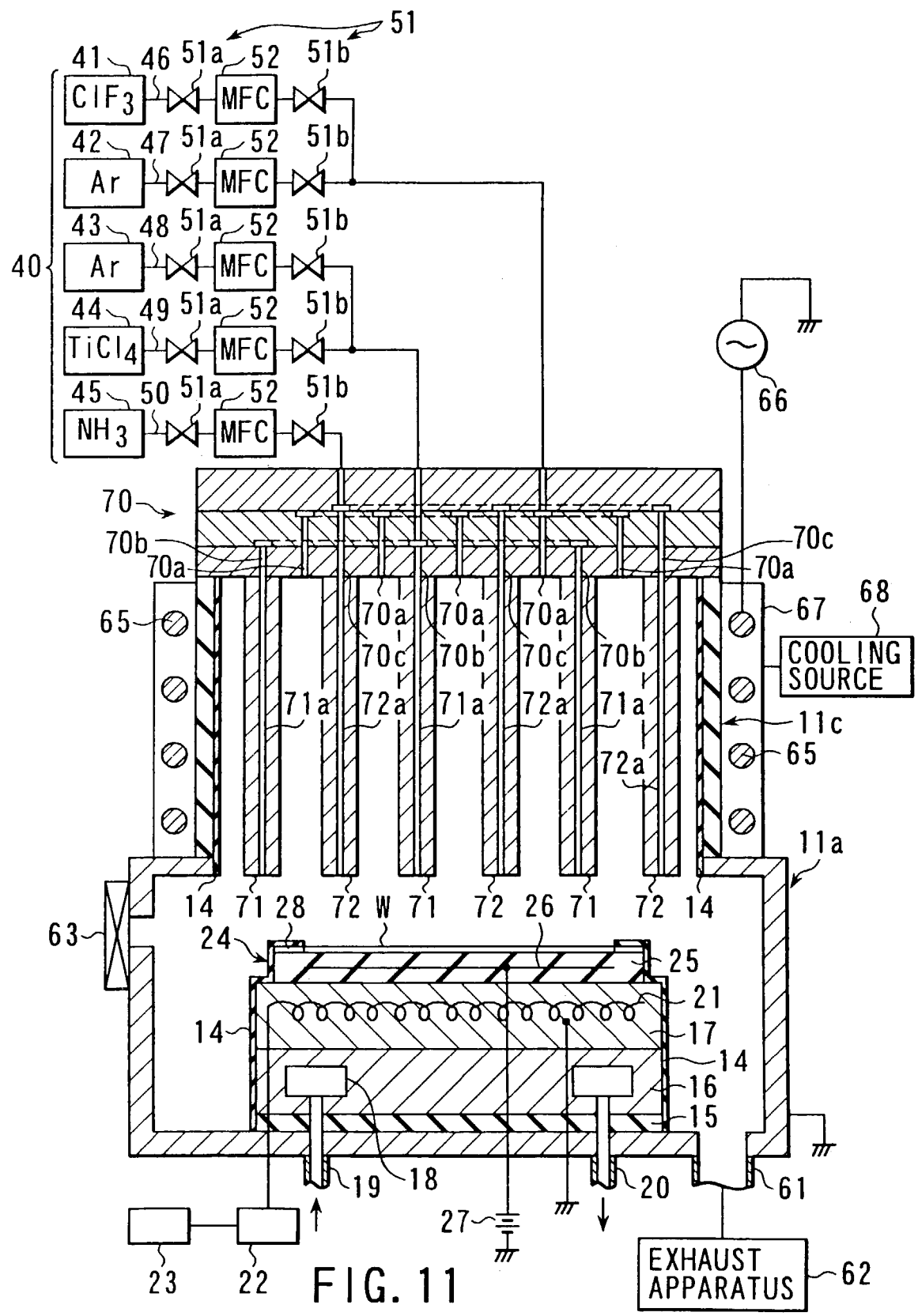
FIG. 11 is a view showing a practical form of a plasma CVD apparatus according to a third embodiment.

FIG. 11 is a cross-sectional view showing a CVD apparatus according to a third embodiment of the present invention.

This embodiment constitutes a combined structure of a lower chamber 11a similar to that in the first embodiment shown in FIG. 1 and an upper chamber 11c similar to that of the second embodiment shown in FIG. 10. A sprayed film 14 of mainly $Al_2O_3$ and $Y_2O_3$ having an insulating property and high corrosion resistance as set out above is formed on the inner wall of the upper chamber 11b. In this embodiment, the same reference numerals are employed to designate parts or elements corresponding in structure to those shown in FIGS. 1 and 10 and any further explanation is, therefore, omitted.

In the third embodiment, a high-corrosion-resistant sprayed film 14 is formed on the inner wall of the upper chamber 11c and, even if plasma and cleaning gas are contacted with the inner wall, is hard to be etched to provide a longer service life to the chamber. In addition, almost no deposit resulting from the process gas is formed on the upper chamber 11b. As a result, unlike the prior art technique, there is no inconvenience of the plasma being attenuated by a conductive film deposited on the inner wall of the chamber and hence no difficulty is encountered in the formation of a film.

It is to be noted that, even in the second and third embodiments, a sprayed film may be formed on the inner wall of the lower chamber 11a and, by forming such a sprayed film, it is possible to improve a high corrosion resistance to the lower chamber 11a.

A fourth embodiment of the present invention will be explained below.

Figure 12:
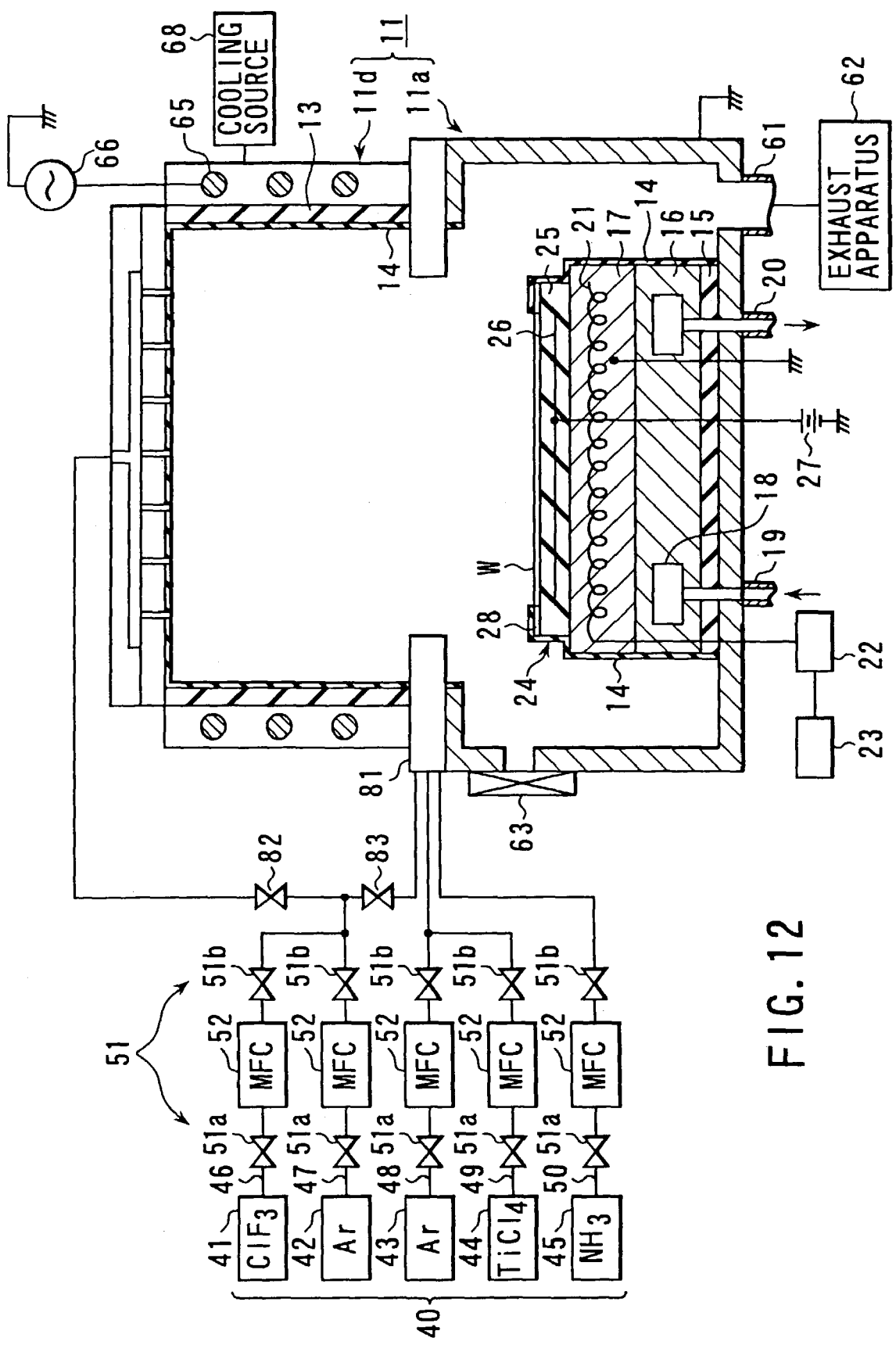
FIG. 12 is a view showing a practical structure of a plasma CVD apparatus according to a fourth embodiment.

FIG. 12 is a cross-sectional view showing a CVD apparatus according to the fourth embodiment of the present invention.

The apparatus structure of this embodiment comprises a combination of a lower chamber 11a similar to that of the above-mentioned first embodiment and an upper chamber 11d different in gas supply position above the lower chamber 11a. In this embodiment, the same reference numerals are employed to designate parts or elements corresponding in structure to those shown in FIG. 1 and any further explanation is, therefore, omitted.

In this film forming apparatus, a shower head 81 for supplying a process gas into a chamber 11 is formed in an annular shape between the upper chamber 11d and the lower chamber 11a. A high corrosion-resistant and insulating sprayed film 14 is formed on the whole inner surface of the upper chamber 11d. A gas supply system 40 is similar in structure to that of the first embodiment but a $ClF_3$ gas serving as a cleaning gas and Ar gas can be introduced from the top side and sidewall side of the upper chamber lid by a switching operation of the valves 82 and 83.

By this structure, a gas supplied from the gas supply system 40 is discharged and directed toward a central area at the upper zone of the lower chamber 11a and diffused onto a wafer W. In this embodiment, it is possible to obtain an effect similar to that of the above-mentioned embodiments. And a deposit resulting from a process gas is almost hardly formed on the inner wall of the upper chamber 11d. Further, a sprayed film 14 is formed on the inner wall of the upper chamber and, even if plasma and cleaning gas are contacted with the inner wall, etching is less liable to occur and it is possible to extend the service life of the chamber.

Figure 13A:
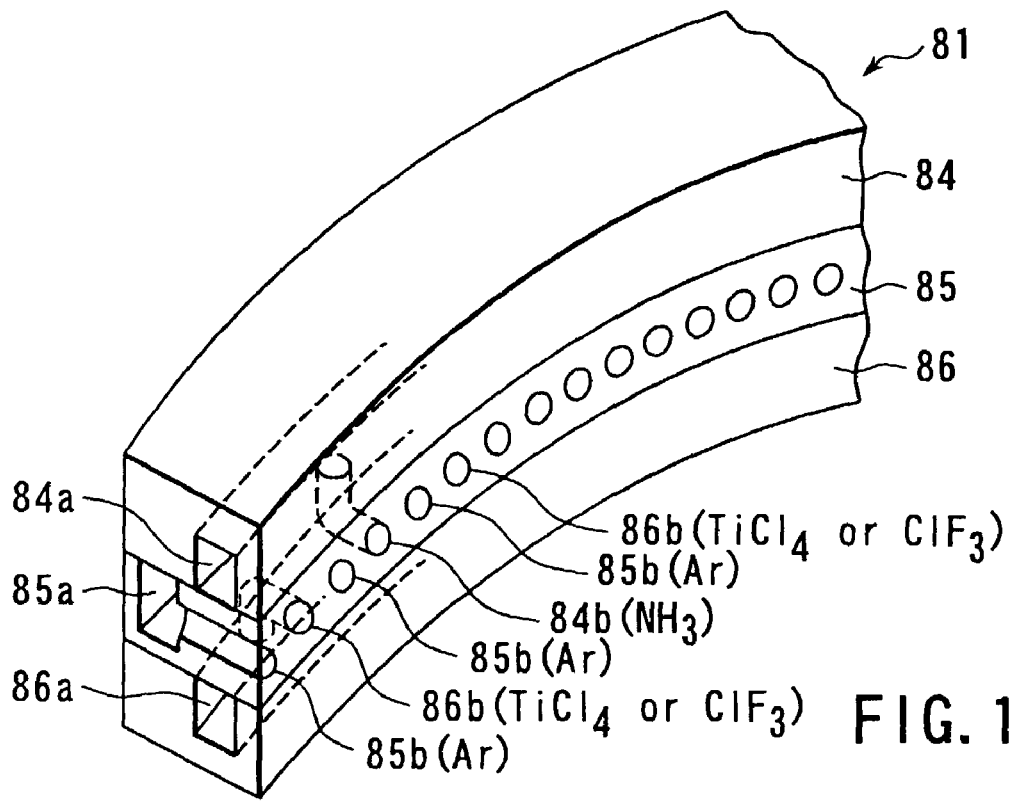
FIGS. 13A and 13B show a practical structure of a shower head in the fourth embodiment.
Figure 13B:
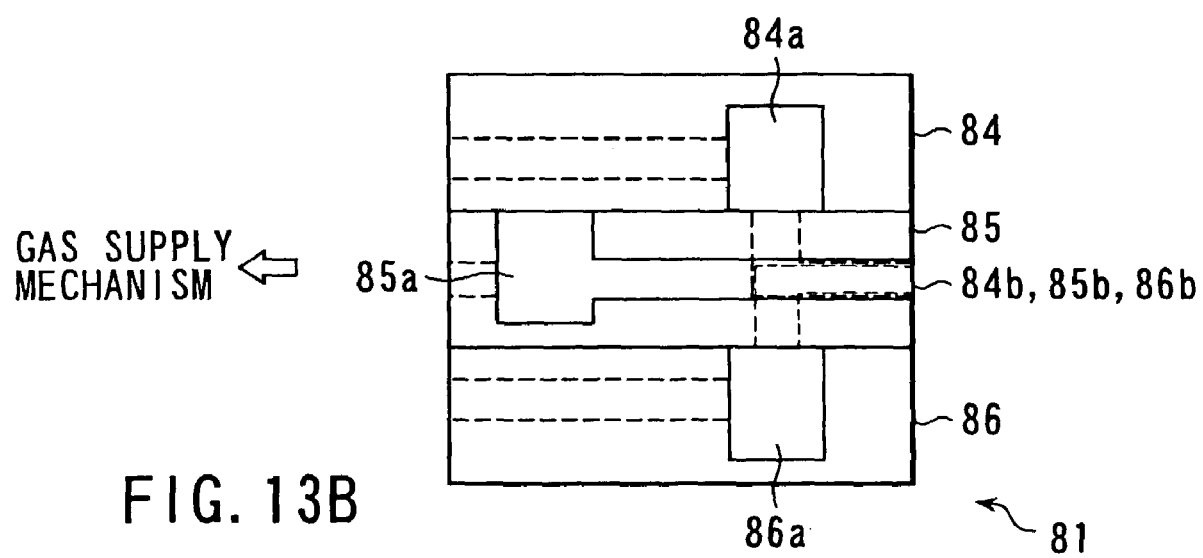

FIGS. 13A and 13B each shows a practical structure of a shower head 81 in this embodiment.

The shower head 81 is comprised of a ring-type three-layered structure and so designed as to collect gases in the respective outer head sections into a middle-layer head section. That is, ring-like diffusion channels 84a, 85a and 86a are provided in the head sections 84, 85 and 86 to allow the process gas to be introduced into the chamber. A plurality of discharge holes 84b ($NH_3$ gas), discharge holes 85b (Ar gas) and discharge holes 86b ($TiCl_4$ gas or $ClF_3$ gas) leading to the diffusion channels 84a, 85a and 86a are provided in a middle layer of the head section 85 in one array to allow a corresponding gas to be discharged in a horizontal direction. For example, these discharge holes are so arranged as to allow different kinds of process gases to be sequentially discharged with an argon gas in between.

In the practical example shown in FIG. 13B, as a first combination the discharge holes 85b, 86b, 85b, 84b, 85b, 86b, . . . , that is, an Ar gas, $TiCl_4$ gas or $ClF_3$ gas, Ar gas, $NH_3$ gas, Ar gas, $TiCl_4$ gas or $ClF_3$ gas, . . . are used. As a second combination, the discharge holes 85b, 86b, 84b, 85b, 85b, 86b, 84b, 85b, . . . , that is, the Ar gas, $TiCl_4$ gas or $ClF_3$, $NH_3$ gas, Ar gas, Ar gas, $TiCl_4$ gas or $ClF_3$ gas, $NH_3$ gas, Ar gas, . . . are used. It is needless to say that these combinations may be properly set depending upon the chamber configuration and process condition, etc. Further, to the $TiCl_4$ gas and $ClF_3$ gas, respective independent discharge holes may be provided.

Figure 14A:
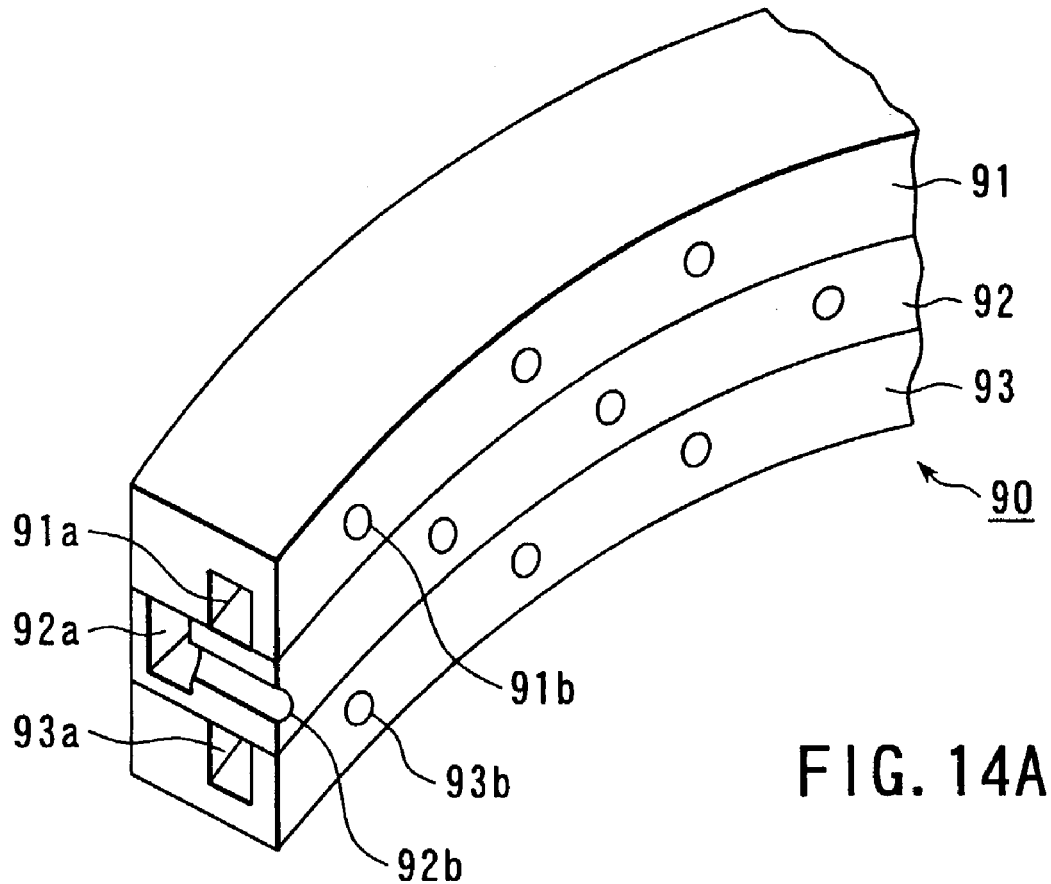
FIGS. 14A and 14B are a view showing a modified structure of the shower head in the fourth embodiment.
Figure 14B:
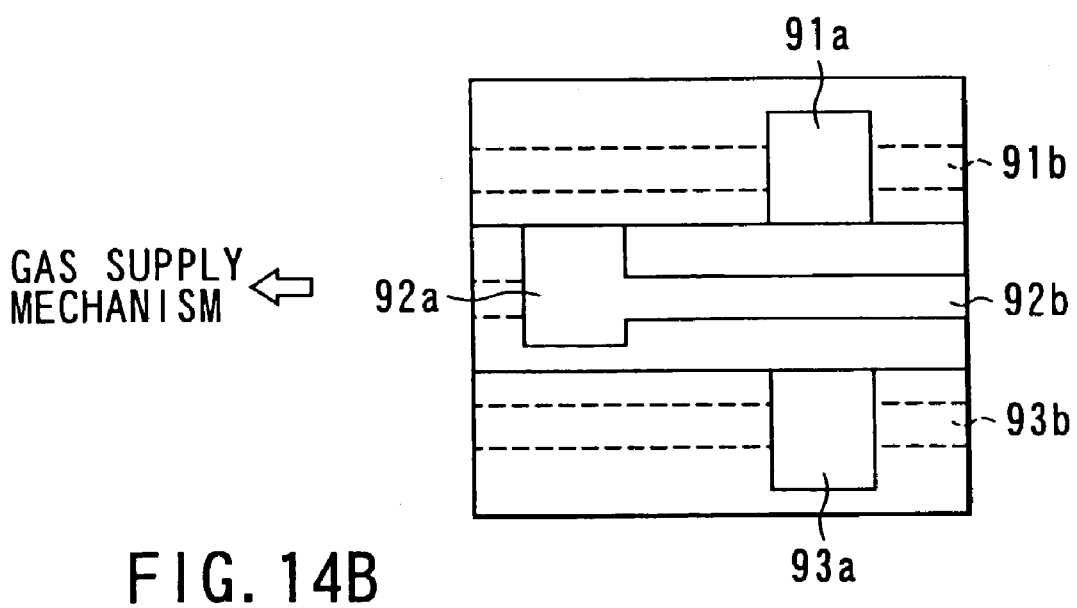

FIGS. 14A and 14B show a modified structure of the above-mentioned shower head 81. Although, in the above-mentioned shower head 81, the gases from the respective head sections are collected into the middle layer head section, this modified structure is of such a type that a plurality of discharge holes are formed in the respective head sections in a not-overlapped fashion in a stacked direction.

This shower head 90 is of a ring-type three-layered structure such that ring-like diffusion channels 91a, 92a and 93a are provided in the corresponding head sections 91, 92 and 93 to allow a process gas to be introduced into the chamber. A plurality of discharge holes 91b ($NH_3$ gas), discharge holes 92b (Ar gas) and discharge holes 93b ($TiCl_4$ gas or $ClF_3$ gas) leading to the diffusion channels 91a, 92a and 93a are formed in the corresponding head sections to allow these gases to be discharged in a horizontal direction.

Various practical structures as shown in FIG. 15 are realized depending upon the order in which these head sections are stacked. In these structures, six cases are shown in FIG. 15. It is to be noted that the $TiCl_4$ gas and $ClF_3$ gas are switchingly used at a film forming time and cleaning time but that independent corresponding discharge holes may be provided for these gases.

Even in these embodiments it is possible to obtain the same advantage as set out in connection with the above-mentioned embodiment.

The shower heads for introducing the gases into the chamber can be variously changed or modified in the embodiment of the present invention.

Although, in the above-mentioned embodiment, a plurality of members are used to introduced the process gas into the chamber 11, as shown in FIG. 16, for example, a shower head is so configured as to have one gas introducing member 95 for allowing a process gas to be supplied from the top side of an upper bell jar onto a wafer W within a lower chamber and a gas discharge section 96 connected to the lower end of the gas introducing member 95 and having a plurality of discharge holes to allow a gas to be spirally supplied down toward the wafer W.

As shown in FIG. 17, a shower head comprises one gas introducing member 97 similar to the gas introducing member 95 and a plurality of gas discharge sections 98 connected to the lower end of the gas introducing member 97, provided in an outwardly branched fashion and having a plurality of discharge holes so provided as to allow a gas to be discharged down onto a wafer W. Further, although two kinds of process gases are separately individually introduced into the chamber, these gases may be introduced together.

Although, in the above-mentioned respective embodiment, the formation of the TiN thin film has been explained, the present invention is not restricted thereto and other films may be formed. In the case where a film is formed using a Ti-containing material or Si-containing material, a Cl-containing gas is used as a feed gas and the present invention is effective to the formation of a film using these materials. As such materials, use is made of, for example, TiN, Ti, TiSiN, SiN, Ta, TaN, $Ta_2O_5$, PZT, BST, RuO and ZrO; a LOWK material, such as SiOF recently used as an insulating interlayer of a low dielectric constant; and Ta, TaN used as a barrier of Cu and SiN used as a corrosion stop.

Although, in the above-mentioned embodiment, use is made of the ICP-CVD apparatus using a coil as an antenna, if the plasma CVD apparatus uses a chamber and bell jar, it can use a TCP (Transformer Coupled Plasma) using a spiral type antenna and it is also possible to use a helicon wave plasma processing apparatus using a helicon wave.

Those applied forms of chambers provided in the processing apparatus according to the above-mentioned embodiments will be explained below with reference to FIGS. 18, 19 and 20. As a lower chamber of the processing apparatus as will be explained below the lower chamber 11a shown in FIG. 1 is taken as an example and, as a gas supply system, a gas supply system for supplying a gas from the sidewall of the chamber shown in FIG. 12 is taken as an example. Here, only the featuring aspect is explained with the same reference numerals employed to designate corresponding parts or elements shown. And an explanation thereof is, therefore, omitted.

Figure 18:
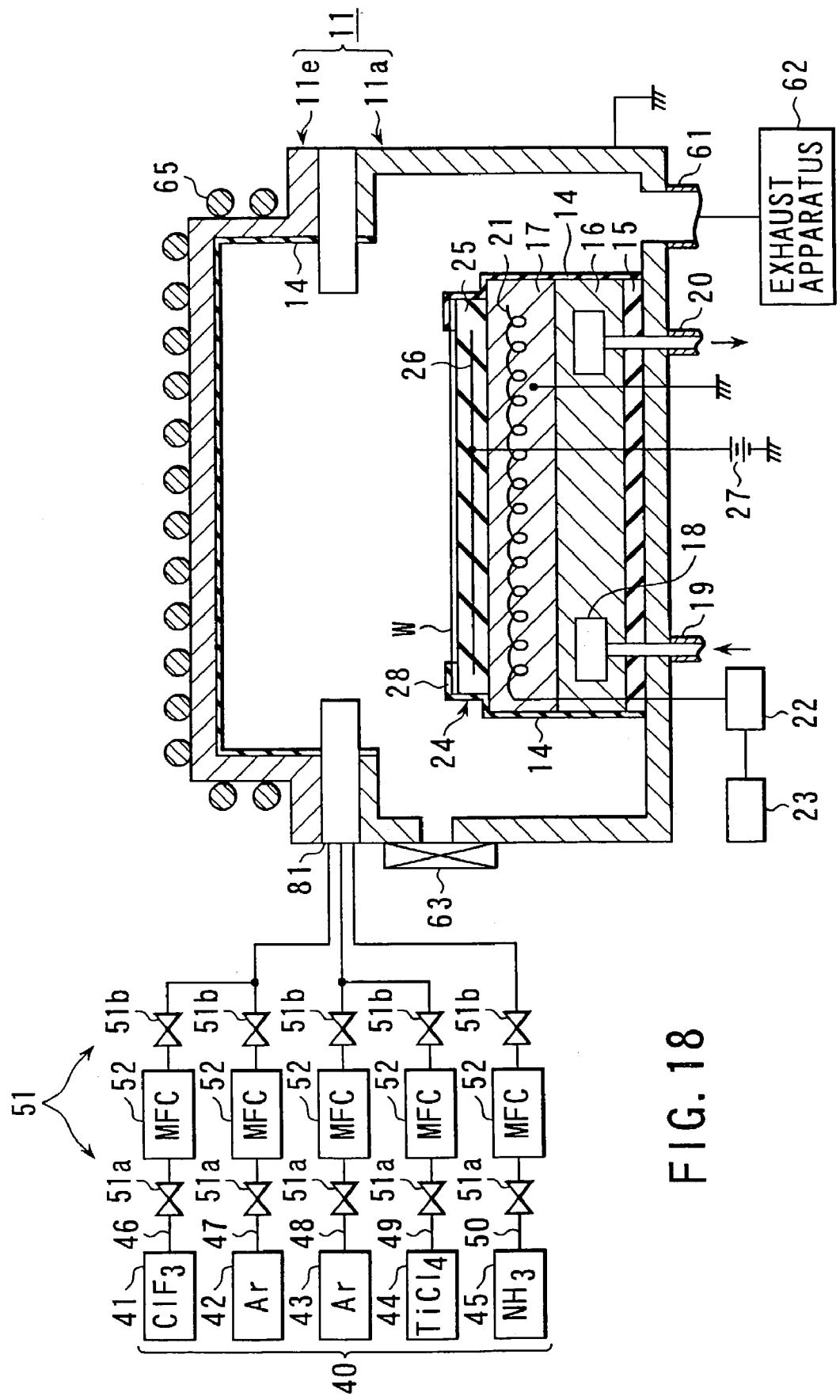
FIG. 18 is a view showing one form of a lower-height thin type chamber.

FIG. 18 is one example of a lower-height thin type chamber. This thin type chamber 11e is thin and has a height (depth) H of, for example, about 0.65 to 10 cm and, preferably, 0.65 to 5 cm. And the distance from the inner top surface of the chamber to a wafer W is about 3.8 to 30 cm and, preferably, 3.8 to 20 cm. Since, in this way, the chamber has a lower-volume shape, an exposed area within the chamber is smaller and hence the apparatus is smaller and ensures an easier maintenance. It is, therefore, possible to alleviate an evacuation load on the system 62.

Figure 19:
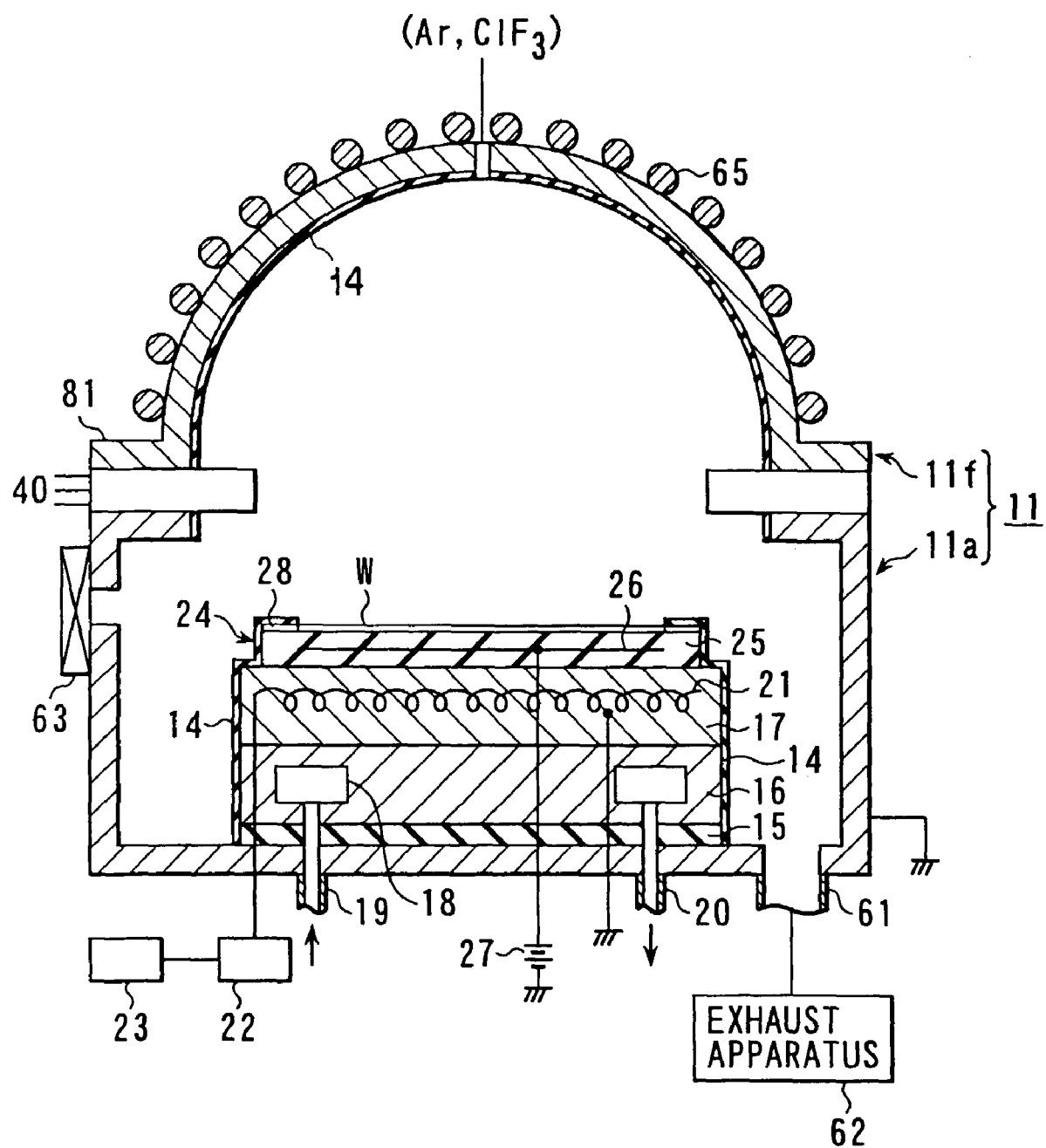
FIG. 19 is a view showing one form of a semi-spherical type chamber.
Figure 20:
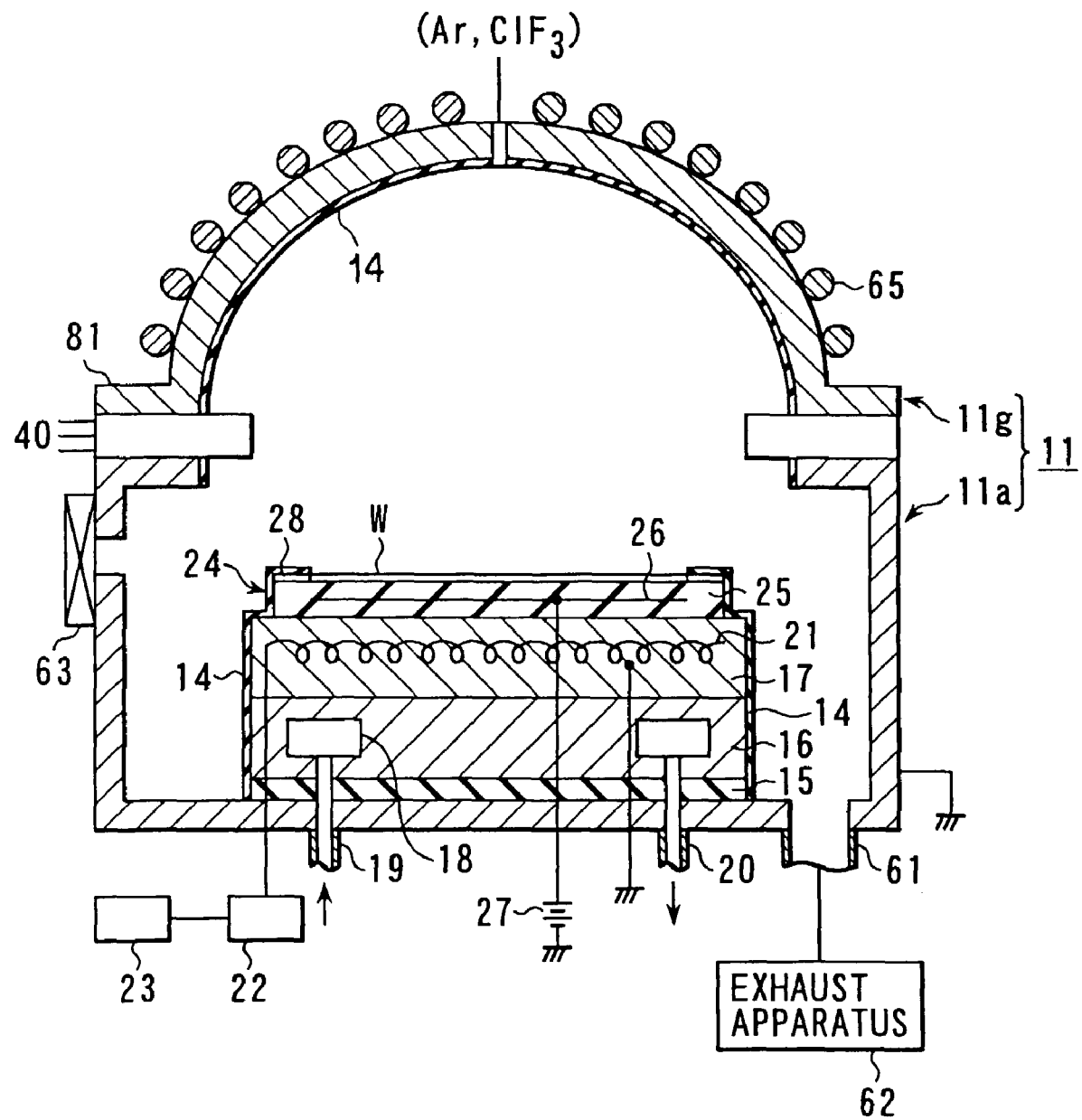
FIG. 20 is a view showing one form of a dome-type chamber.

An upper chamber 11f shown in FIG. 19 is of a semispherical type, that is, a bell jar type and an upper chamber 11g shown in FIG. 20 is of a dome-shaped type. According to these upper chambers, the distribution of an electric field by an antenna relative to the wafer W is made uniform compared with that of a box-type chamber and hence the thickness profile of a formed film, etching, etc., are made uniform.

Figure 21:
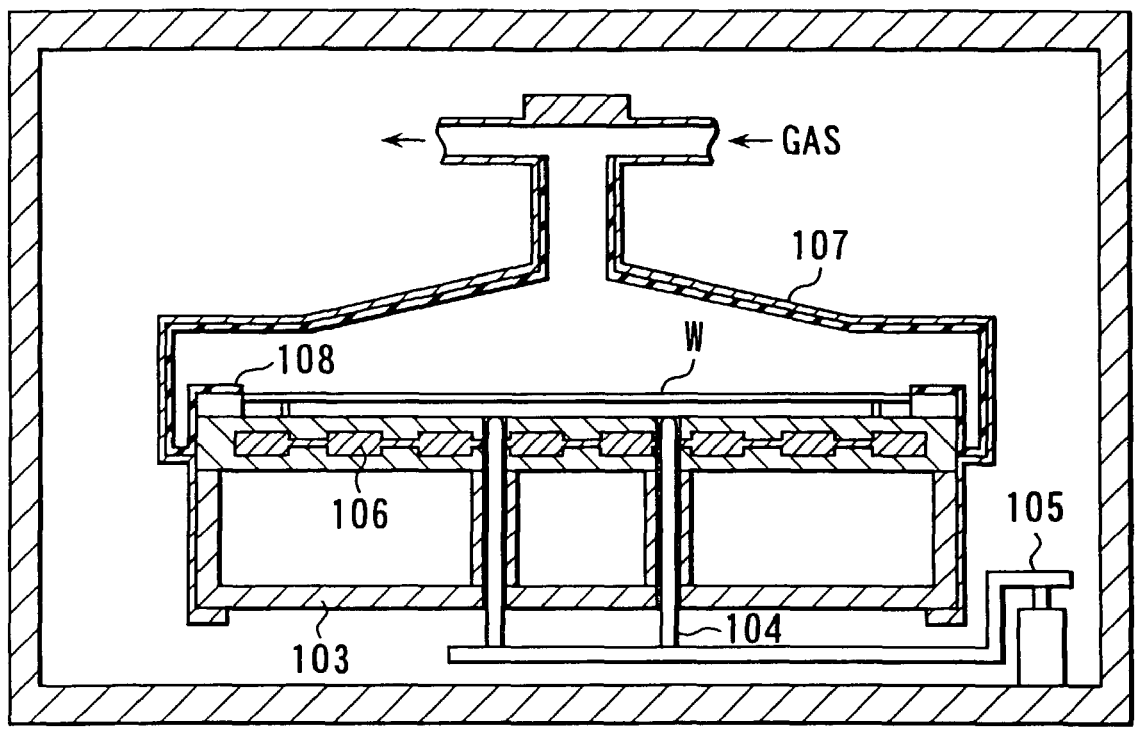
FIG. 21 is a view showing a practical structure of a heat processing apparatus.

FIG. 21 is a view showing a practical structure applied to a heat processing apparatus as a fifth embodiment in a processing apparatus with a mounted chamber having a high-corrosion-resistant sprayed film according to the present invention.

The heat processing apparatus 101 can perform an anneal process for promoting recrystallization of a formed film and a thermal oxidation process.

This heat processing apparatus 101 has a susceptor 103 located within a chamber 102 to support a wafer W, a wafer lifting mechanism 105 provided below the susceptor 103 to allow the wafer W to be lifted up by a plurality of lift pins 104 at a transfer of the wafer W, a heater 106 provided in the susceptor 103 and a gas flow chamber 107 for hermetically supplying a gas such as an Ar gas and oxygen gas onto the wafer W. A sprayed film 14 of $Al_2O_3/Y_2O_3$ is formed on the inner surface of the gas flow chamber 107 and on the surface of a guide section 108 provided on the susceptor 103 to guide a wafer mounting position and, by doing so, it is possible to obtain the same effect as in the above-mentioned respective embodiments.

Figure 22:
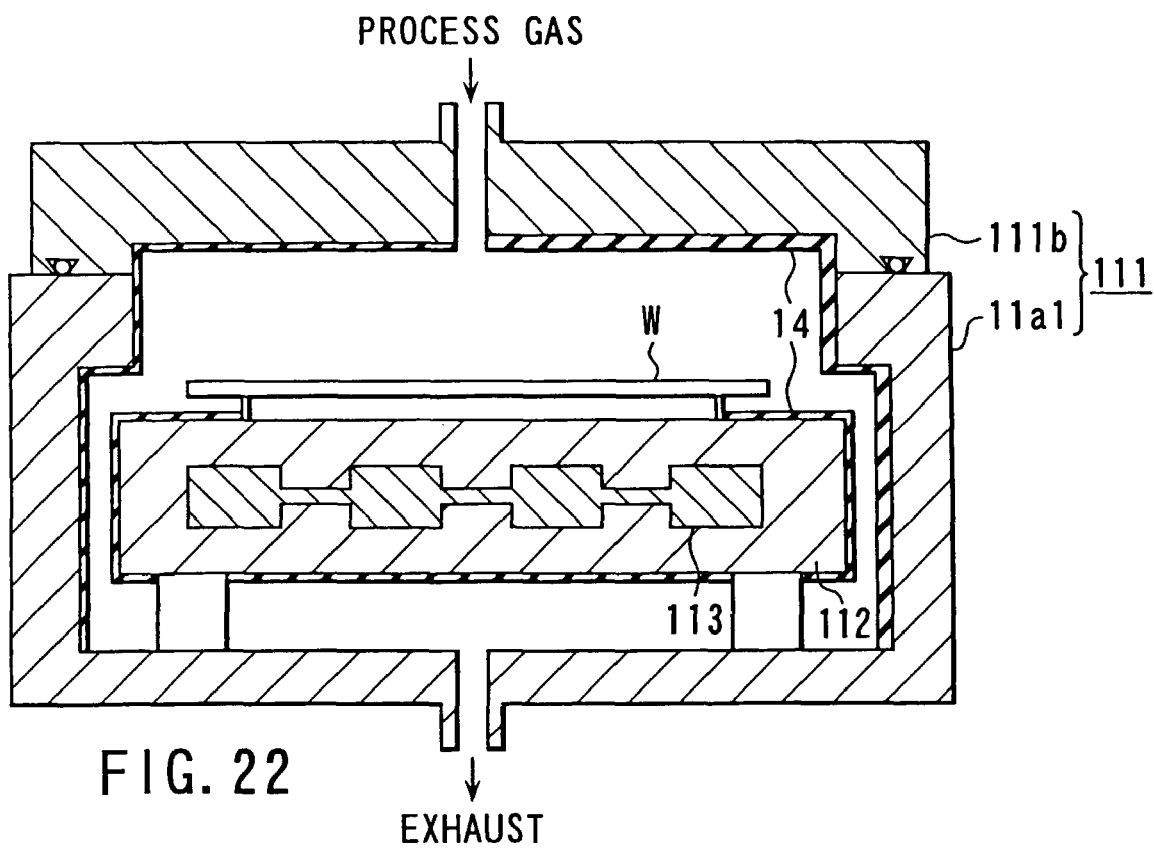
FIG. 22 is a view showing a practical structure of an ashing apparatus.

FIG. 22 is a view showing a practical structure applied to an ashing apparatus as a sixth embodiment in a processing apparatus with a mounted chamber having a high-corrosion-resistant sprayed film according to the present invention.

The ashing apparatus comprises a hermetically sealable chamber 111 having a lower chamber 111a and upper chamber 111b, a susceptor 112 on which a wafer W is placed, a heater 113 provided in the susceptor 112 to heat the wafer W, a gas supply system, not shown, for supplying a process gas such as oxygen, and an evacuation apparatus for evacuating the interior of the chamber 111.

In this ashing apparatus, a high-corrosion-resistant sprayed film is formed on the whole inner surface of the upper chamber 111b and on the sidewall of the lower chamber 111a except the inner bottom surface and, by doing so, it is possible to obtain the same effect as in the above-mentioned respective embodiment.

Figure 23:
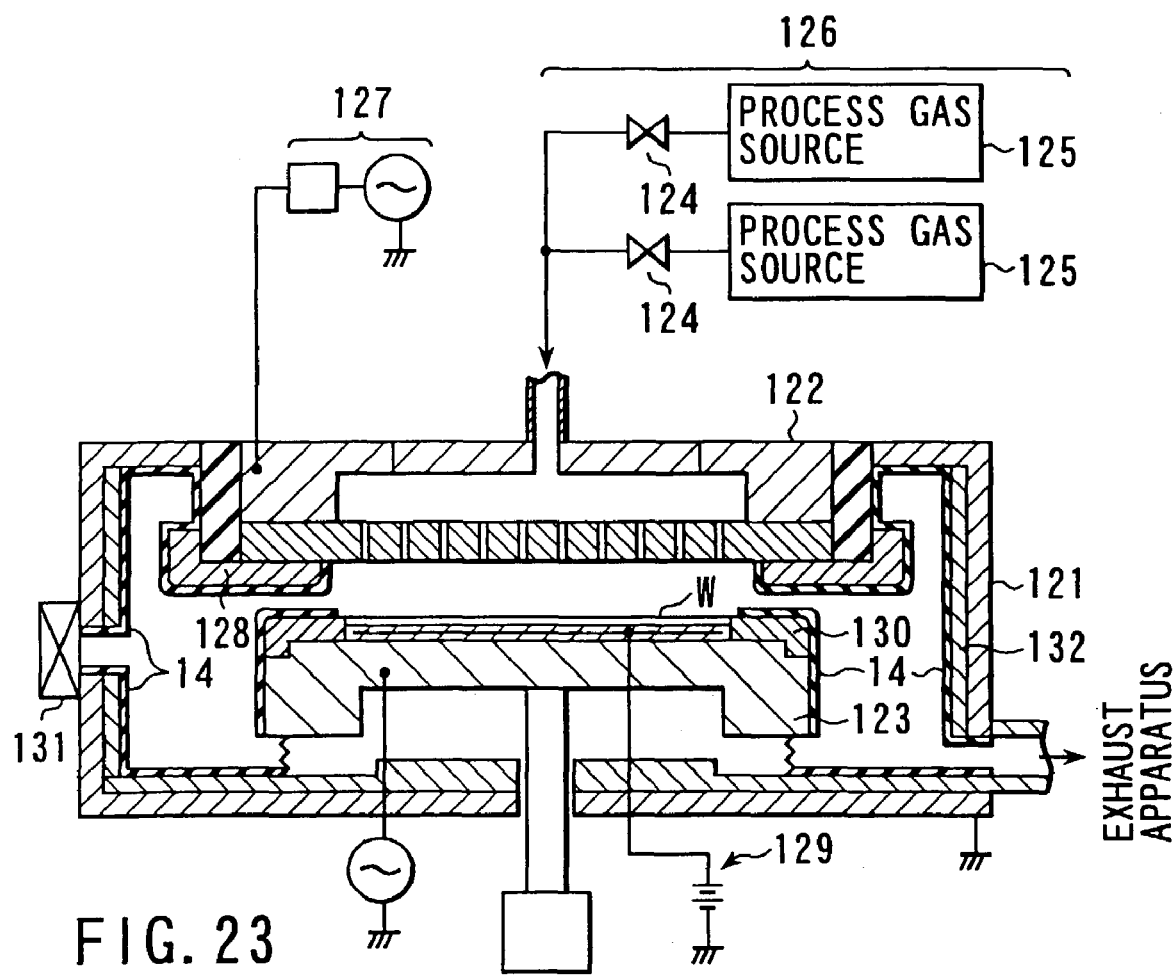
FIG. 23 is a view showing a practical structure of an etching apparatus.

FIG. 23 is a view showing a practical structure applied to an etching apparatus as a seventh embodiment in a processing apparatus with a mounted chamber having a high-corrosion-resistant sprayed film according to the present invention.

This etching apparatus comprises a hermetically sealable chamber 121, a process gas supplying shower head provided within the chamber 121 and functioning as an upper electrode for plasma generation, a susceptor 123 allowing a wafer W to be placed and functioning as an upper electrode for plasma generation, a process gas supply system 126 having a plurality of valves 124 and a plurality of process gas sources 125, a high frequency power source 127 for applying a high frequency power to the shower head 122, a shield ring 128 provided around the shower head 122, an electrostatic chuck system 129 provided on the top surface of the susceptor 123, a focusing ring 130 provided at an outer peripheral portion of the electrostatic chuck 129 to surround the wafer W, a gate valve 131 provided on the sidewall of the chamber 121 to allow the wafer to be loaded and unloaded into and out of the chamber 121, and a deposition shield 132 provided on the inner side surface of the chamber 121.

A sprayed film 14 is formed, as the above-mentioned case, on exposed surfaces of the susceptor 123, focusing ring 130, shower head 122 and shield ring 128 within the chamber and further on the inner upper surface and inner bottom surface of the chamber 121.

Figure 24:
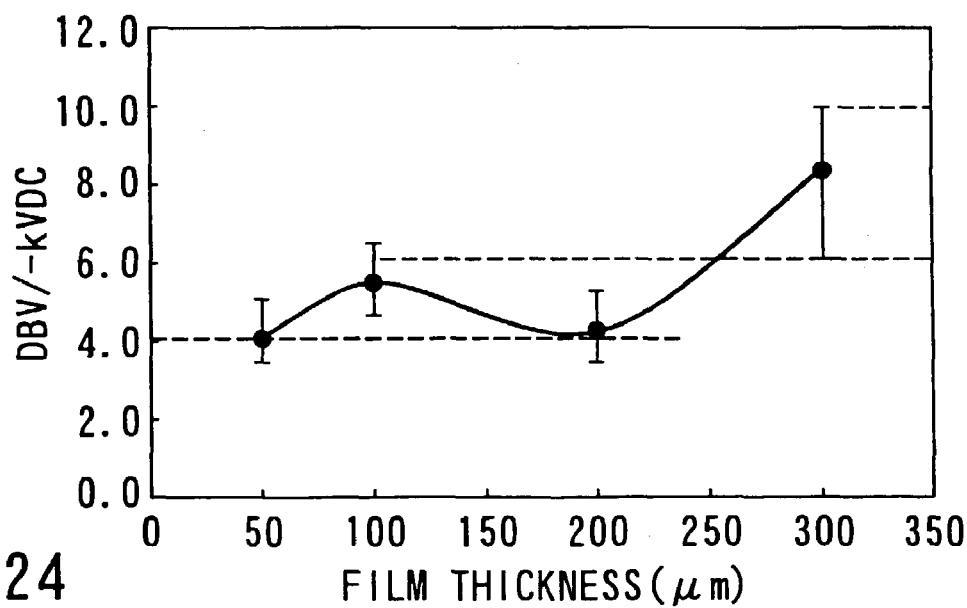
FIG. 24 is a view showing a relation of a breakdown voltage to the thickness of the sprayed film in the respective embodiment of the present invention.

It is to be noted that the sprayed film formed in the above-mentioned respective embodiments need only have a thickness of above 50 μm. In the case where the thickness of the sprayed film is less than 50 μm, the insulating resistance and withstand voltage are lower. This is based on our empirically obtained data showing a relation of a breakdown voltage to the film thickness shown in FIG. 24. According to FIG. 24, out of the film thickness range of 50 to 300 μm is preferable.

Even in this embodiment, the same effect as set out in connection with the above-mentioned embodiment can be obtained by forming the sprayed film.

Although, in the above-mentioned respective embodiments, the semiconductor wafer as a substrate has been explained by way of example, the present invention is not restricted thereto and it may also be applied to the formation of a glass substrate for a liquid crystal display device (LCD).

According to the above-mentioned respective embodiments, a sprayed film of substantially $Al_2O_3/Y_2O_3$ whose weight ratio is above 0.5 is formed on the inner wall of the chamber and, by doing so, the chamber is less liable to be etched under a plasma and cleaning gas due to the presence of the high-corrosion resistant sprayed film. Thus the present invention can be preferably applied to the film formation, etching, ashing and heat treatment on a less-etching thermal sprayed film of the chamber.

Further, since the gas supply system supplies a process gas near the upper zone of a wafer within the chamber, the gas hardly reaches the inner wall of the chamber and almost no product is deposited on the wall. As a material for the chamber, use can be made of a ceramic ($Al_2O_3$, $SiO_2$, AlN, etc.), aluminum, stainless steel, metal or alloy.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma processing apparatus, which processes a semiconductor substrate or a substrate of a liquid crystal display, the plasma processing apparatus comprising:
   a process container configured to accommodate a target substrate;
   a support member configured to support the target substrate inside the process container;
   a gas supply mechanism configured to supply a process gas into the process container;
   an exhaust mechanism configured to exhaust gas from inside the process container; and
   a plasma generation mechanism configured to generate plasma from the process gas inside the process container,
   wherein a predetermined portion of the process container to be exposed to the plasma is covered with a protection film for protecting the predetermined portion from the plasma, and the protection film is a thermal sprayed film of $Al_2O_3$ and $Y_2O_3$, with a weight ratio of $Al_2O_3$ relative to $Y_2O_3$ being 0.5 to 4 and is a surface-polished film having a thickness of larger than 50 μm.

2. The plasma processing apparatus according to claim 1, wherein the weight ratio of $Al_2O_3$ relative to $Y_2O_3$ is 0.5 to 1.5.

3. The plasma processing apparatus according to claim 1, wherein the weight ratio of $Al_2O_3$ relative to $Y_2O_3$ is 0.66 to 1.5.

4. The plasma processing apparatus according to claim 1, wherein the protection film has a thickness of smaller than 300 μm.

5. The plasma processing apparatus according to claim 1, wherein the protection film has plasma resistance such that an amount of etching of the protection film by plasma of $CF_4$, Ar, and $O_2$ is smaller than an amount of etching of a $Y_2O_3$ film by the plasma.

6. The plasma processing apparatus according to claim 1, wherein the support member is covered with a support member protection film having the same composition as the protection film for protecting the predetermined portion.

7. The plasma processing apparatus according to claim 1, wherein the process container comprises a lower chamber and an upper chamber disposed above the lower chamber such that the lower chamber forms an accommodation space for accommodating a target substrate and the upper chamber forms a plasma generation space for generating plasma, and the upper chamber includes a wall portion having an inner surface covered with the protection film, and
   the plasma generation mechanism includes an antenna disposed outside the wall portion of the upper chamber and configured to be supplied with electrical power.

8. The plasma processing apparatus according to claim 7, wherein the lower chamber consists of aluminum with an anodized surface, and the wall portion of the upper chamber consists of $Al_2O_3$, $SiO_2$, or AlN.

9. The plasma processing apparatus according to claim 7, wherein the wall portion of the upper chamber forms a sidewall portion of the process container, and the antenna includes a portion disposed around the sidewall portion.

10. The plasma processing apparatus according to claim 7, wherein the wall portion of the upper chamber forms a flat ceiling portion of the process container, and the antenna includes a portion disposed along the ceiling portion.

11. The plasma processing apparatus according to claim 7, wherein the wall portion of the upper chamber forms a semispherical or dome-shaped ceiling portion of the process container, and the antenna includes a portion disposed along the ceiling portion.

12. The plasma processing apparatus according to claim 7, wherein the plasma processing apparatus is configured to form a TiN film on the target substrate, and the gas supply mechanism is configured to supply $NH_3$ gas and $TiCl_4$ gas into the process container.

13. The plasma processing apparatus according to claim 1, wherein the plasma generation mechanism includes a lower electrode and an upper electrode disposed inside the process container and configured to be supplied with an electrical power across the lower and upper electrodes, and the support member is combined with the lower electrode.

14. The plasma processing apparatus according to claim 13, wherein the plasma processing apparatus is configured to etch the target substrate, and the gas supply mechanism includes a showerhead combined with the upper electrode.

15. A plasma processing apparatus, which processes a semiconductor substrate or a substrate of a liquid crystal display, the plasma processing apparatus comprising:
   a process container configured to accommodate a target substrate;
   a susceptor configured to support the target substrate inside the process container and to adjust a temperature of the target substrate;

a gas supply mechanism configured to supply a process gas into the process container;

an exhaust mechanism configured to exhaust gas from inside the process container; and a plasma generation mechanism configured to generate plasma from the process gas inside the process container, wherein a predetermined portion of the susceptor to be exposed to the plasma is covered with a protection film for protecting the predetermined portion from the plasma, and the protection film is a thermal sprayed film of $Al_2O_3$ and $Y_2O_3$ with a weight ratio of $Al_2O_3$ relative to $Y_2O_3$ being 0.5 to 4 and is a surface-polished film having a thickness of larger than 50 μm.

16. The plasma processing apparatus according to claim 15, wherein the weight ratio of $Al_2O_3$ relative to $Y_2O_3$ is 0.5 to 1.5.

17. The plasma processing apparatus according to claim 15, wherein the weight ratio of $Al_2O_3$ relative to $Y_2O_3$ is 0.66 to 1.5.

18. The plasma processing apparatus according to claim 15, wherein the protection film has a thickness of smaller than 300 μm.

19. The plasma processing apparatus according to claim 15, wherein the protection film has plasma resistance such that an amount of etching of the protection film by plasma of $CF_4$, Ar, and $O_2$ is smaller than an amount of etching of a $Y_2O_3$ film by the plasma.

* * * * *